United States Patent
Raisanen et al.

(10) Patent No.: US 8,383,525 B2
(45) Date of Patent: Feb. 26, 2013

(54) PLASMA-ENHANCED DEPOSITION PROCESS FOR FORMING A METAL OXIDE THIN FILM AND RELATED STRUCTURES

(75) Inventors: Petri Raisanen, Gilbert, AZ (US); Steven Marcus, Tempe, AZ (US)

(73) Assignee: ASM America, Inc., Phoenix, AZ (US)

( * ) Notice: Subject to any disclaimer, the term of this patent is extended or adjusted under 35 U.S.C. 154(b) by 379 days.

(21) Appl. No.: 12/109,859

(22) Filed: Apr. 25, 2008

(65) Prior Publication Data
US 2009/0269941 A1    Oct. 29, 2009

(51) Int. Cl.
*H01L 21/31* (2006.01)
(52) U.S. Cl. .................................. 438/778; 427/255.32
(58) Field of Classification Search ................. 438/778; 427/255.32
See application file for complete search history.

(56) References Cited

U.S. PATENT DOCUMENTS

| | | |
|---|---|---|
| 4,058,430 A | 11/1977 | Suntola et al. |
| 4,134,425 A | 1/1979 | Gussefeld et al. |
| 4,282,267 A | 8/1981 | Küyel |
| 4,389,973 A | 6/1983 | Suntola et al. |
| 4,477,296 A | 10/1984 | Nair |
| 4,612,432 A | 9/1986 | Sharp-Geisler |
| 4,747,367 A | 5/1988 | Posa |
| 4,761,269 A | 8/1988 | Conger et al. |
| 4,767,494 A | 8/1988 | Kobayashi et al. |
| 4,851,095 A | 7/1989 | Scobey et al. |
| 4,927,670 A | 5/1990 | Erbil |
| 4,935,661 A | 6/1990 | Heinecke et al. |
| 4,991,540 A | 2/1991 | Jurgensen et al. |
| 5,071,670 A | 12/1991 | Kelly |
| 5,166,092 A | 11/1992 | Mochizuki et al. |
| 5,173,474 A | 12/1992 | Connell |
| 5,180,435 A | 1/1993 | Markunas et al. |
| 5,221,556 A | 6/1993 | Hawkins et al. |

(Continued)

FOREIGN PATENT DOCUMENTS

| | | |
|---|---|---|
| DE | 41 08 73 | 3/1925 |
| EP | 0 387 892 | 9/1990 |

(Continued)

OTHER PUBLICATIONS

File History of U.S. Appl. No. 60/730,986, filing date Oct. 27, 2005.

(Continued)

*Primary Examiner* — David Vu
*Assistant Examiner* — Caleb Henry
(74) *Attorney, Agent, or Firm* — Knobbe, Martens, Olson & Bear LLP (57) ABSTRACT

Methods of forming metal oxide thin films and related structures are provided. One embodiment of the methods includes conducting a plurality of cycles of deposition on a substrate. Each cycle includes supplying oxygen gas and an inert gas into a reaction space substantially continuously during the cycle. A metal precursor is supplied into the reaction space for a first duration. The metal precursor is a cyclopentadienyl compound of the metal. After the metal precursor is supplied, the continuously flowing oxygen gas is activated for a second duration to generate a plasma in the reaction space. The cycle is conducted at a temperature below about 400° C. The methods can be performed after forming a structure on the substrate, wherein the structure is formed of a material which is physically and/or chemically unstable at a high temperature.

26 Claims, 7 Drawing Sheets

U.S. PATENT DOCUMENTS

| | | |
|---|---|---|
| 5,225,366 A | 7/1993 | Yoder |
| 5,225,561 A | 7/1993 | Kirlin et al. |
| 5,244,501 A | 9/1993 | Nakayama et al. |
| 5,270,247 A | 12/1993 | Sakuma et al. |
| 5,276,010 A | 1/1994 | Sasaki |
| 5,278,435 A | 1/1994 | Van Hove |
| 5,281,274 A | 1/1994 | Yoder |
| 5,291,066 A | 3/1994 | Neugebauer |
| 5,292,370 A | 3/1994 | Tsai et al. |
| 5,294,286 A | 3/1994 | Nishizawa |
| 5,300,186 A | 4/1994 | Hitahara |
| 5,304,279 A | 4/1994 | Coultas et al. |
| 5,314,759 A | 5/1994 | Harkonen et al. |
| 5,321,713 A | 6/1994 | Khan |
| 5,330,610 A | 7/1994 | Eres |
| 5,356,673 A | 10/1994 | Schmitt et al. |
| 5,370,738 A | 12/1994 | Watanabe et al. |
| 5,374,570 A | 12/1994 | Nasu |
| 5,382,333 A | 1/1995 | Ando et al. |
| 5,395,791 A | 3/1995 | Cheng |
| 5,443,033 A | 8/1995 | Nishizawa |
| 5,443,647 A | 8/1995 | Aucoin et al. |
| 5,447,909 A | 9/1995 | Takahashi et al. |
| 5,453,305 A | 9/1995 | Lee |
| 5,458,084 A | 10/1995 | Thorne |
| 5,469,806 A | 11/1995 | Mochizuki |
| 5,483,919 A | 1/1996 | Yokoyama et al. |
| 5,484,664 A | 1/1996 | Kitahara |
| 5,488,967 A | 2/1996 | Minami et al. |
| 5,496,582 A | 3/1996 | Mizutani et al. |
| 5,496,597 A | 3/1996 | Soininen et al. |
| 5,521,126 A | 5/1996 | Okamura et al. |
| 5,614,055 A | 3/1997 | Fairbairn et al. |
| 5,617,290 A | 4/1997 | Kulwicki et al. |
| 5,618,395 A | 4/1997 | Gartner |
| 5,641,984 A | 6/1997 | Aftergut |
| 5,669,975 A | 9/1997 | Ashtiani |
| 5,693,139 A | 12/1997 | Nishizawa et al. |
| 5,707,880 A | 1/1998 | Aftergut |
| 5,711,811 A | 1/1998 | Suntola et al. |
| 5,724,015 A | 3/1998 | Tai et al. |
| 5,730,802 A | 3/1998 | Ishizumi |
| 5,731,634 A | 3/1998 | Matsuo et al. |
| 5,767,628 A | 6/1998 | Keller et al. |
| 5,769,950 A | 6/1998 | Takasu et al. |
| 5,811,022 A | 9/1998 | Savas et al. |
| 5,831,431 A | 11/1998 | Gottfried-Gottfried et al. |
| 5,855,680 A | 1/1999 | Soininen et al. |
| 5,865,365 A | 2/1999 | Nishikawa et al. |
| 5,902,639 A | 5/1999 | Glassman et al. |
| 5,904,780 A | 5/1999 | Tomoyasu |
| 5,912,068 A | 6/1999 | Jia |
| 5,916,365 A | 6/1999 | Sherman |
| 5,923,056 A | 7/1999 | Lee et al. |
| 5,939,334 A | 8/1999 | Nguyen et al. |
| 5,942,855 A | 8/1999 | Hopwood |
| 5,972,430 A | 10/1999 | DiMeo, Jr. et al. |
| 5,993,916 A | 11/1999 | Zhao et al. |
| 6,006,763 A | 12/1999 | Mori et al. |
| 6,015,590 A | 1/2000 | Suntola et al. |
| 6,033,584 A | 3/2000 | Ngo et al. |
| 6,036,878 A | 3/2000 | Collins |
| 6,054,013 A | 4/2000 | Collins et al. |
| 6,060,755 A | 5/2000 | Ma et al. |
| 6,066,892 A | 5/2000 | Ding et al. |
| 6,074,953 A | 6/2000 | Donohoe et al. |
| 6,077,384 A | 6/2000 | Collins et al. |
| 6,087,257 A | 7/2000 | Park et al. |
| 6,099,904 A | 8/2000 | Mak et al. |
| 6,104,074 A | 8/2000 | Chen |
| 6,113,759 A | 9/2000 | Uzoh |
| 6,113,977 A | 9/2000 | Soininen et al. |
| 6,114,252 A | 9/2000 | Donohoe et al. |
| 6,117,788 A | 9/2000 | Ko |
| 6,124,189 A | 9/2000 | Watanabe et al. |
| 6,130,123 A | 10/2000 | Liang et al. |
| 6,136,720 A | 10/2000 | Donohoe et al. |
| 6,139,700 A | 10/2000 | Kang et al. |
| 6,144,060 A | 11/2000 | Park et al. |
| 6,156,151 A | 12/2000 | Komino et al. |
| 6,177,135 B1 | 1/2001 | Hintermaier et al. |
| 6,184,146 B1 | 2/2001 | Donohoe et al. |
| 6,184,158 B1 | 2/2001 | Shufflebotham et al. |
| 6,188,134 B1 | 2/2001 | Stumborg et al. |
| 6,197,683 B1 | 3/2001 | Kang et al. |
| 6,200,389 B1 | 3/2001 | Miller et al. |
| 6,200,893 B1 | 3/2001 | Sneh |
| 6,203,613 B1 | 3/2001 | Gates et al. |
| 6,207,589 B1 | 3/2001 | Ma et al. |
| 6,248,605 B1 | 6/2001 | Harkonen et al. |
| 6,263,831 B1 | 7/2001 | Gorin |
| 6,265,222 B1 | 7/2001 | DiMeo et al. |
| 6,266,712 B1 | 7/2001 | Henrichs |
| 6,270,572 B1 | 8/2001 | Kim et al. |
| 6,297,539 B1 | 10/2001 | Ma et al. |
| 6,303,500 B1 | 10/2001 | Jiang et al. |
| 6,305,314 B1 | 10/2001 | Sneh et al. |
| 6,306,216 B1 | 10/2001 | Kim et al. |
| 6,323,131 B1 | 11/2001 | Obeng et al. |
| 6,342,277 B1 | 1/2002 | Sherman |
| 6,346,151 B1 | 2/2002 | Jiang et al. |
| 6,364,949 B1 | 4/2002 | Or et al. |
| 6,368,987 B1 | 4/2002 | Kopacz et al. |
| 6,383,669 B1 | 5/2002 | Leedham et al. |
| 6,391,146 B1 | 5/2002 | Bhatnagar et al. |
| 6,391,803 B1 | 5/2002 | Kim et al. |
| 6,407,435 B1 | 6/2002 | Ma et al. |
| 6,416,822 B1 | 7/2002 | Chiang et al. |
| 6,428,859 B1 | 8/2002 | Chiang et al. |
| 6,432,260 B1 | 8/2002 | Mahoney et al. |
| 6,433,432 B2 | 8/2002 | Shimizu |
| 6,444,568 B1 | 9/2002 | Sundararajan et al. |
| 6,446,573 B2 | 9/2002 | Hirayama et al. |
| 6,475,276 B1 | 11/2002 | Elers et al. |
| 6,482,740 B2 | 11/2002 | Soininen et al. |
| 6,503,330 B1 | 1/2003 | Sneh et al. |
| 6,511,539 B1 | 1/2003 | Raaijmakers |
| 6,534,395 B2 | 3/2003 | Werkhoven et al. |
| 6,548,424 B2 | 4/2003 | Putkonen |
| 6,576,053 B1 | 6/2003 | Kim et al. |
| 6,583,057 B1 | 6/2003 | Alluri et al. |
| 6,645,574 B1 | 11/2003 | Lee et al. |
| 6,723,642 B1 | 4/2004 | Lim et al. |
| 6,730,164 B2 | 5/2004 | Vaartstra et al. |
| 6,752,869 B2 | 6/2004 | Lee et al. |
| 6,800,567 B2 | 10/2004 | Cho |
| 6,824,816 B2 | 11/2004 | Aaltonen et al. |
| 6,858,546 B2 | 2/2005 | Niinisto et al. |
| 6,984,591 B1 | 1/2006 | Buchanan et al. |
| 7,108,747 B1 | 9/2006 | Leskela et al. |
| 7,141,278 B2 | 11/2006 | Koh et al. |
| 7,220,669 B2 | 5/2007 | Hujanen et al. |
| 7,351,658 B2 | 4/2008 | Putkonen |
| 7,396,565 B2 * | 7/2008 | Yang et al. ............... 427/255.32 |
| 7,482,037 B2 * | 1/2009 | Derderian et al. ....... 427/255.31 |
| 7,485,349 B2 | 2/2009 | Koh et al. |
| 2001/0003064 A1 | 6/2001 | Ohto |
| 2001/0018266 A1 | 8/2001 | Jiang et al. |
| 2001/0024387 A1 | 9/2001 | Raaijmakers et al. |
| 2001/0034123 A1 | 10/2001 | Jeon et al. |
| 2001/0041250 A1 | 11/2001 | Werkhoven et al. |
| 2001/0051215 A1 | 12/2001 | Arkles et al. |
| 2001/0052318 A1 | 12/2001 | Jiang et al. |
| 2002/0011215 A1 | 1/2002 | Tei et al. |
| 2002/0013487 A1 | 1/2002 | Norman et al. |
| 2002/0027286 A1 | 3/2002 | Sundararajan et al. |
| 2002/0066411 A1 | 6/2002 | Chiang et al. |
| 2002/0068458 A1 | 6/2002 | Chiang et al. |
| 2002/0073924 A1 | 6/2002 | Chiang et al. |
| 2002/0076481 A1 | 6/2002 | Chiang et al. |
| 2002/0076490 A1 | 6/2002 | Chiang et al. |
| 2002/0076507 A1 | 6/2002 | Chiang et al. |
| 2002/0076508 A1 | 6/2002 | Chiang et al. |
| 2002/0104481 A1 | 8/2002 | Chiang et al. |
| 2002/0142588 A1 | 10/2002 | Basceri et al. |
| 2002/0153579 A1 | 10/2002 | Yamamoto |
| 2002/0164421 A1 | 11/2002 | Chiang et al. |

| | | | |
|---|---|---|---|
| 2002/0164423 | A1 | 11/2002 | Chiang et al. |
| 2002/0173054 | A1 | 11/2002 | Kim |
| 2002/0197402 | A1 | 12/2002 | Chiang et al. |
| 2003/0010452 | A1 | 1/2003 | Park et al. |
| 2003/0015137 | A1 | 1/2003 | Sakai et al. |
| 2003/0072882 | A1 | 4/2003 | Niinisto et al. |
| 2003/0089314 | A1 | 5/2003 | Matsuki et al. |
| 2003/0124875 | A1 | 7/2003 | Kil |
| 2003/0165615 | A1 | 9/2003 | Aaltonen et al. |
| 2003/0176047 | A1 | 9/2003 | Doan et al. |
| 2004/0028811 | A1 | 2/2004 | Cho et al. |
| 2004/0043149 | A1* | 3/2004 | Gordon et al. ............ 427/255.31 |
| 2004/0125541 | A1 | 7/2004 | Chung |
| 2004/0231799 | A1 | 11/2004 | Lee et al. |
| 2005/0009325 | A1 | 1/2005 | Chung et al. |
| 2005/0020092 | A1 | 1/2005 | Putkonen |
| 2005/0037154 | A1 | 2/2005 | Koh et al. |
| 2005/0089632 | A1 | 4/2005 | Vehkamaki et al. |
| 2005/0208754 | A1 | 9/2005 | Kostamo et al. |
| 2005/0255243 | A1* | 11/2005 | Senzaki ..................... 427/248.1 |
| 2006/0013955 | A1* | 1/2006 | Senzaki ..................... 427/248.1 |
| 2006/0128150 | A1 | 6/2006 | Gandikota et al. |
| 2006/0177601 | A1 | 8/2006 | Park et al. |
| 2006/0219157 | A1 | 10/2006 | Rahtu et al. |
| 2007/0036892 | A1 | 2/2007 | Haukka et al. |
| 2007/0054048 | A1 | 3/2007 | Haukka et al. |
| 2008/0072819 | A1 | 3/2008 | Rahtu et al. |
| 2008/0102205 | A1 | 5/2008 | Barry et al. |
| 2009/0035946 | A1 | 2/2009 | Pierreux et al. |

FOREIGN PATENT DOCUMENTS

| | | |
|---|---|---|
| EP | 0 442 490 A | 8/1991 |
| EP | 0 469 470 A1 | 2/1992 |
| EP | 0 526 779 A1 | 2/1993 |
| EP | 0 880 168 A2 | 11/1998 |
| FI | 981959 | 3/2000 |
| FI | 105313 | 7/2000 |
| GB | 2 340 508 A | 2/2000 |
| JP | 63015442 | 1/1988 |
| JP | 64-027131 | 1/1989 |
| JP | 1-305524 | 12/1989 |
| JP | 3-214734 | 9/1991 |
| JP | 5-198512 | 8/1993 |
| JP | 09-63963 | 3/1997 |
| JP | 10-060673 | 3/1998 |
| JP | 2001-284269 | 10/2001 |
| KR | 10-2000-0003455 | 1/2000 |
| KR | 10-2000-0049298 | 8/2000 |
| KR | 10-2000-0060332 | 10/2000 |
| KR | 10-2003-0038167 | 5/2003 |
| WO | WO 93/10652 | 5/1993 |
| WO | WO 96/17107 | 6/1996 |
| WO | WO 00/03420 | 1/2000 |
| WO | WO 00/12964 | 3/2000 |
| WO | WO 00/15865 | 3/2000 |
| WO | WO 00/54320 | 9/2000 |
| WO | WO 00/61833 | 10/2000 |
| WO | WO 00/63957 | 10/2000 |
| WO | WO 00/79576 | 12/2000 |
| WO | WO 01/17692 | 3/2001 |
| WO | WO 01/36702 | 5/2001 |
| WO | WO 01/99166 | 12/2001 |
| WO | WO 02/08488 | 1/2002 |
| WO | WO 02/27063 | 4/2002 |
| WO | WO 03/016587 | 2/2003 |
| WO | WO 03/041142 | 5/2003 |
| WO | WO 2006/131751 | 12/2006 |

OTHER PUBLICATIONS

Aarik et al., "Effect of Growth Conditions on Formation of $TiO_2$-II Thin Films in Atomic Layer Deposition Process" Appl. Surf. Sci. 112,259 (1997).

Abeles, B. et al., "Amorphous Semiconductor Superlattices," *Physical Review Letters*, vol. 51, No. 21, pp. 2003-2006 (1983).

Advances in Organometallic Chemistry, Ed. Stone and West, vol. 40, Academic Press (1996).

Ahonen et al., "A Study of ZnTe Films Grown on Glass Substrates Using an Atomic Layer Evaporation Method" Thin Solid Films 65, 301 (1980).

Ait-Lhouss et al., "Atomic Layer Epitaxy of GaAs from Tertiarybutylarsine and Triethylgallium" J. Appl. Phys. 78, 5834 (1995).

Akazawa, "Characterization of Self-limiting $SiH_2Cl_2$ Chemisorption and Photon-stimulated Desorption as Elementary Steps for Atomic-layer Epitaxy" Phys. Rev. B 54, 10917 (1996).

APEX New Release, Apex Introduces Radical Assisted CVD Technology, which Delievers Revolutionary High-Quality, Low-Temp Solutions Beyond LPCVD, PECVD Limitations. For release on Feb. 5, 2003 or later.

Ares et al., "Growth mechanisms in Atomic layer Epitaxy of GaAs" J. Appl. Phys. 83, 3390 (1998).

Asif Khan et al., "Atomic Layer Epitaxy of GaN over Sapphire using Switched Metalorganic Chemical Vapor Deposition" Appl. Phys. Lett. 60, 1366 (1992).

Asif Khan et al., "GaN/AlN Digital Alloy Short-period Superlattices by Switched Atomic Layer Metalorganic Chemical Vapor Deposition" Appl. Phys. Lett. 63, 3470 (1993).

Asikainen et al., "AFM and STM Studies on $In_2O_3$ and ITO Thin Films Deposited by Atomic Layer Epitaxy" Appl. Sur. Sci. 99, 91 (1996).

Asikainen et al., "Growth of Indium-Tin-Oxide Thin Films by Atomic Layer Epitaxy" J. Electrochem. Soc., 142,3538 (1995).

Asikainen et al., "Growth of $In_2O_3$ Thin Films by Atomic Layer Epitaxy" J. Electrochem. Soc., 141,3210 (1994).

Baglia, J., Associate Editor, "New designs and materials tackle 1 Gb memory challenges," *Semiconductor International*, www.semiconductor.net, Nov. 2000.

Basceri, C. Ph.D. thesis, "Electrical and Dielectric Properties of $(BA,SR)TiO_3$ Thin Film Capacitors for Ultra-High Density Dynamic Random Access Memories," 1997, pp. 13-31, Raleigh, N.C. State University.

Bedair, S.M., "Atomic Layer Epitaxy Deposition Processes," *J. Vac. Sci Technol.* B 12(1), Jan./Feb. 1994, pp. 179-185.

Bedair et al., "Atomic Layer Epitaxy of III-V Binary Compounds" Appl. Phys. Lett. 47, 51 (1985).

Bilodeau et al., "MOCVD $BaSrTiO_3$ for $\geq$1-Gbit DRAMs," *Solid State Technology*, pp. 235-242 (Jul. 1997).

Buchan et al., "Epitaxial Growth of GaAs with $(C_2H_5)_2GaCl$ and $AsH_3$ in a Hot Wall system" J. Cryst. Growth 107, 331 (1991).

Bursky, D., "Hit Up IEDM for Gigabit and Denser DRAMs and Merged Logic/Memory," *Electronic Design*, World Wide Web address: planetee.com, Dec. 1, 1998.

Campbell, S.A. et al., "Titanium dioxide ($TiO_2$)-based gate insulators," *IBM J. Res. Develop.*, May 1999, vol. 43, No. 3, pp. 383-392.

Chen et al., "Metalorganic Chemical Vapor Deposition of Indium Phosphide by Pulsing Precursors" Appl. Phys. Lett. 55, 987 (1989).

Dapkus et al., "Atomic Layer Epitaxy for the Growth of Heterostructures" Proc. Intern. Electron Devices Mtg. IEEE 472 (1988).

De Keijser, M. et al., "Atomic layer epitaxy of gallium arsenide with the use of atomic hydrogen," *Appl. Phys. Lett.*, vol. 58, No. 11, pp. 1187-1189 (1991).

Doi et al., "Stepwise Molecular Growth of GaAs by Switched Laser Metalorganic vapor Phase Epitaxy" Appl. Phys. Lett. 49, 785 (1986).

Dosho et al., "Atomic Layer Epitaxy of ZnSe-ZnTe Strained Layer Superlattices" J. Crys. Growth 95, 580 (1989).

Ducso et al., "Deposition of Tin Oxide into Porous Silicon by Atomic Layer Epitaxy" J. Electrochem. Soc., 143, 683 (1996).

Elers et al., "$NbCl_5$ as a Precursor in Atomic Layer Epitaxy" Appl. Surf. Sci., 82/83, 468 (1994).

Eres et al., "The Role of Hydride Coverage in Surface-limited Thin-film Growth of Epitaxial Silicon and Germanium" J. Appl. Phys. 74,7241 (1993).

Fan et al., "Low Temperature Growth of Thin Films of $Al_2O_3$ by Sequential Surface Chemical reaction of Trimethylaluminum and $H_2O_2$" Jpn. J. Appl. Phys., 30, L1139 (1991).

Fan, J. F. et al., "Low-Temperature Growth of Thin Films, of $Al_2O_3$ with Trimethylaluminum and Hydrogen Peroxide," *Mat. Res. Soc. Symp. Proc.*, vol. 222, pp. 327-332 (1991).

Faschinger et al., "Observation of Different Reflected High-energy Electron Diffraction Patterns during Atomic Layer Epitaxy Growth of Cd'Te Epilayers" J. Cryst. Growth 115, 692 (1991).

Fujii et al., "Atomic Layer Epitaxy of AlAs using Trimethylamine-alane and Amino-As" Appl. Phys. Lett. 62, 1420 (1993).

Fujii et al., "Desorption Properties of Amine Species during Atomic Layer Epitaxy of GaAs using Amino-As" Appl. Phys. Lett. 61, 2577 (1992).

Fujiwara et al., "Low Temperature Growth of $ZnS_xSe_{1-x}$ Alloys Fabricated by Hydrogen Radical Enhanced Chemical vapor Deposition in an Atomic Layer Epitaxy Mode" J. Appl. Phys. 74, 5510 (1993).

Fukuzumi, Y. et al., "Liner-Supported Cylinder (LSC) Technology to Realize $Ru/Ta_2O_5/Ru$ Capacitor for Future DRAMs," IEEE, 2000, IED 2000, Session 34.

Garcia et al., "Preparation of YSZ layers by MOCVD: influence of experimental parameters on the morphology of the films," *Journal of Crystal Growth*, vol. 156, (1995); pp. 426-432.

Gong et al., "Atomic Layer Epitaxy of AlGaAs" Appl. Phys. Lett. 57, 400 (1990).

Goodman et al., "Atomic Layer Epitaxy" J. Appl. Physics 60, R65 (1986).

Gordon et al. "Vapor Deposition of Metal Oxides and Silicates: Possible Gate Insulators for Future Microelectronics"; *Chem. Mater.*; vol. 13; pp. 2463-2464 (2001).

Gotoh et al., "Low-temperature growth of ZnSe-based Pseudomorphic Structures by Hydrogen-radical-enhanced Chemical vapor Deposition" .T. Cryst. Growth 117, 85 (1992).

Greenwood, N.N. and Earnshaw, A., Chemistry of the Elements, 1$^{st}$ edition, *Pergamon Press* (1986).

Hartmann et al., "Atomic Layer Epitaxy of CdTe and MnTe" *1*. Appl. Phys. 79, 3035 (1996).

Hasunuma et al., "Gas-phase-reaction-controlled Atomic-layer-epitaxy of Silicon" J. Vac. Sci. Technol., A 16, 679 (1998).

Haukka et al, "Growth mechanisms of Mixed Oxides on Alumina" Appl. Surf. Sci. 112, 23 (197).

Herman, M.A., "Atomic Layer Epitaxy—12 Years later" Vacuum 42, (1991).

Herman et al., "Atomic Layer Epitaxy of $Cd_{1-x}Mn_xTe$ Grown on CdTe(111)B Substrates" J. Crst. Growth 66, 480 (1984).

Herman et al., "Surface Morphology of CdTe Films Grown on CdTe(111) Substrates by Atomic Layer Epitaxy" J. Cryst. Growth 73, 403 (1985).

Hiramatsu, K. et al., "Formation of TiN films with low Cl concentration by pulsed plasma chemical vapor deposition," *J. Vac. Sci. Technol. A*, vol. 14, No. 3, pp. 1037-1040 (1996).

Hones, P. et al., "MOCVD of Thin Ruthenium Oxide Films: Properties and Growth Kinetics," *Chem. Vap. Deposition*, 2000, vol. 6, No. 4, pp. 193-198.

Hong et al., "Epitaxial cubic gadolinium oxide as a dielectric for gallium arsenide passivation," *Science*, 1999, pp. 1897-1900, vol. 283.

Horikoshi et al., "Low-temperature Growth of GaAs and AlAs-GaAs Quantumwell Layers by Modified Molecular Beam Epitaxy" Jpn. J. Appl. Phys. 25, L868 (1986).

Hunter et al., "A Novel Atmospheric Pressure Technique for the Deposition of ZnS by Atomic Layer Epitaxy Using Dimethylzinc" J. Cryst. Growth 91, 111 (1988).

Hyvarinen et al., "Mass Spectrometry Study of ZnS Atomic Layer Epitaxy Process" J. Cryst. Growth 86, 695 (1988).

Ihanus et al., "AFN Studies on ZnS Thin Films Grown by Atomic Layer Epitaxy" Appl. Surf. Sci. 120, 43 (1997).

Ihanus et al., "ALE Growth of $ZnS_{1-x}Sc_x$ Thin Films by Substituting Surface Sulfer with Elemental Selenium" Appl. Surf. Sci. 112, 154 (1997).

Imai et al.., "A Novel Atomic Layer Method of Silicon" Jpn. J. Appl. Phys. 30, 3646 (1991).

Imai, S. et al., "Atomic layer epitaxy of Si using atomic H," *Thin Solid Films*, vol. 225, pp. 168-172 (1993).

Inoue, N. et al., "Low thermal-budget fabrication of sputtered-PZT capacitor on multilevel interconnects for embedded FeRAM," *IEEE*, IED 2000, 2000, Session 34.

Integrated Circuit Engineering Corporation, Practical Integrated Circuit Fabrication Seminar (1998).

Jung, D. et al., "A Novel $Ir/IrO_2/Pt$-PZT-$Pt/IrO_2/Ir$ Capacitor for a Highly Reliable Mega-Scale FRAM," *IEEE*, IED 2000, 2000, Session 34.

Juppo et al, "Deposition of Copper Films by an Alternate Supply of CuCl and Zn" J. Alternate Vac. Sci. Technol., A 15, 2330 (1997).

Juppo et al., "Deposition of Molybdenum Thin Films by an Alternate Supply of $MoCl_5$ and Zn" J. Vac. Sci. Technol., A 16, 2845 (1998).

Juza et al., "Experimental Test of the Transition Layer Model of Atomic Layer Epitaxy" Appl, Phys. Lett. 53, 1396 (1988).

Kang et al., "Deposition Characteristics of (Ba, Sr) $TiO_3$ Thin Films by Liquid Source Metal-Organic Chemical Vapor Deposition at Low Substrate Temperatures," *Jpn. J. Appl. Phys.*, vol. 36, pp. 6946-6952 (1997).

Kawakyu et al., "GaAs Atomic Layer Epitaxy Using the KrF Excimer Laser" Jpn. J. Appl. Phys. 28, L1439 (1989).

Kawamoto, Y. et al., "The Outlook for Semiconductor Processes and Manufacturing Technologies in the 0.1-μm Age," *Hitachi Review*, 1999, vol. 48, No. 6, pp. 334-339.

Kimura et al., "Atomic Layer Epitaxy of ZnSe on GaAs(IOOO) by Metalorganic Molecular Beam Epitaxy" J. Cryst. Growth 116, 283 (1992).

Kiyotoshi et al., "Chemical Vapor Deposition of High Quality (Ba, Sr)$TiO_3$ Thin Films Using Individual Vaporizing Liquid Source Supply System," *Electrochemical Society Proceedings*, vol. 97-25, pp. 1063-1070 (1997).

Koleski et al., "Atomic Layer Epitaxy of Si on Gc(100) : Direct Recoiling Studies of Film Morphology" J. Appl. Phys. 76, 1615 (1994).

Koleski, D. D. et al., "Atomic layer epitaxy of Si on Ge(100) using $Si_2Cl_6$ and atomic hydrogen," *Appl. Phys. Lett.*, vol. 64, No. 7, pp. 884-886 (1994).

Koleski et al., "Growth of Si on Si(100) via *H/Cl* Exchange and the Effect of Interfacial Boron" J. Appl. Phys. 72, 4073 (1992).

Koleski et al., "Precursors for Si Atomic Layer Epitaxy: Real Time Adsorption Studies on Si(100)" Appl. Phys. Lett. 61, 1802 (1992).

Kong et al., "White Light Emitting SrS:Pr Electroluminescent Devices Fabricated via Atomic Layer Epitaxy" Appl. Phys. Lett. 66,419 (1995).

Kuech et al., "Selective Epitaxy in the Conventional Metalorganic Vapor Phase Epitaxy of GaAs" Appl. Phys. Ltrs. 54, 910 (1989).

Kukli et al., "Atomic Layer epitaxy Growth of Aluminum Oxide Thin Films from a novel $Al(CH_3)_2Cl$ Precursor and $H_2O$" J. Vac. Sci. Technol, A 15, 2214 (1997).

Kukli et al., "Atomic Layer Epitaxy Growth of Tantalum Oxide Thin Films from $Ta(OC_2H_5)_5$ and $H_2O$" J. Electrochem. Soc., 142, 1670 (1995).

Kukli et al., "In Situ study of Atomic Layer epitaxy Growth of Tantalum Oxide thin films from $Ta(OC_2H_5)_5$ and $H_2O$" Appl. Surf. Sci. 112, 236 (1997).

Kukli et al., "Tailoring the Dielectric Properties of $HfO_2$-$Ta_2O_5$ Nanolaminates" Appl. Phys. Lett. 68, 3737 (1996).

Kumagai et al., "Comparative Study of $Al_2O_3$ Optical Crystalline Thin Films grown by Vapor Combinations of $Al(CH_3)_3/N_2O$ and $Al(CH_3)_3/H_2O_2$," Jpn. J.. Appl. Phys., 32, 6137 (1993).

Kurtz et al., "Self-organized CdSe/ZnSe Quantum Dots on a ZnSe (I11)A Surface" J. Cryst. 184/185, Growth 242 (1998).

Kwon et al., "Plasma-Enhanced Atomic layer Depositoin of Ruthenium Thin Films," *Electrochemical & Solid State Letters*, 7(4) C46-C48 (Feb. 2004).

Lakomaa et al., "Surface-Reactions in $Al_2O_3$ Growth from Trimethylaluminum and Water by Atomic Layer Epitaxy" Appl. Surf. Sci. 107, 107 (1996).

Lee et al., "Growth of ZnSe on (100) GaAs by Atomic Layer Epitaxy" J. Cryst. Growth 117, 148 (1992).

Lee et al. "Self Limiting Growth on Nominally Oriented (111)A GaAs Substrates in Atomic Layer epitaxy" Appl. Surf. Sci. 103, 275 (1996).

Leskela et al., "ALD Precursor Chemistry: Evolution and future challenges," *J. Phys. IV France* 9: 837-847 (1999).

Leskelä, M. et al., "Atomic Layer Epitaxy in Deposition of Various Oxide and Nitride Thin Films," *Journal De Physique IV, Colloque C5, supplément au Journal de Physique II*, vol. 5, pp. C5-937-C5-951 (1995).

Leskela, M., "Atomic Layer Epitaxy in the Growth of Poly crystalline and Amorphous Films" Acta Polytechn. Scand., Ser. Chem. Techn., 195, 67 (1990).

Lin et al., "Adsorption and Thermal Reactions of Disilane and the Growth of Si Films on Ge(100)-(2x1)" Phys. Rev. B 47, 6543 (1993).

Maa et al., "Surface Reactions in the Atomic Layer Epitaxy of GaAs using Arsine" Appl. Phys. Lett. 58, 1762 (1991).

Mahajan, A. et al. "Si atomic layer epitaxy based on $Si_2H_6$ and remote He plasma bombardment," *Thin Solid Films*, vol. 225, pp. 177-182 (1993).

Mahajan, et al., "Surface Chemistry of Diethylsilane and Diethylgermane on Si(100):An Atomic Layer Epitaxy Approach" J. Vac. Sci. Technol. 12A, 2265 (1994).

Martenson et al., "Halide chemical vapour deposition of $Bi_2Sr_2CaCu_2O_{8+x}$: aspects of epitaxy," *Journal of Crystal Growth*, vol. 156, pp. 67-73 (1995).

Martensson et al., "Atomic Layer Epitaxy of Copper" J. Electrochem. Soc. , 145, 2926 (1998).

Matsunami et al., "Hetero-inferface Control and Atomic Layer Epitaxy of SiC" Appl. Surf. Sci. 112, 171 (1997).

Matthée et al., "Orientation relationships of epitaxial oxide buffer layers on silicon (100) for high-temperature superconducting Yba2Cu3O7-x films,"*Appl, Phys. Lett.*, vol. 61, No. 10, (1992), pp. 1240-1242.

McDermott et al., "Atomic Layer Epitaxy of the Ga-As-In-As Superalloy" Appl. Phys. Lett. 51, 1830 (1987).

McMurran et al., "Development of a Low-Temperature GaN Chemical Vapor Deposition Process based on a single Molecular Source $H_2GaN_3$" Appl. Phys. Lett., 74, 883 (1999).

Meguro et al., "Effects of Active Hydrogen on Atomic Layer Epitaxy of GaAs" Appl. Surf. Sci. 112, 118 (1997).

Molsa et al., "Growth of Yttrium Oxide Thin Films from β-Diketonate Precursor," *Advanced Materials for Optics and Electronics*, vol. 4, (1994), pp. 389-400.

Mölsä et al., "Growth of Yttrium Oxide Thin Films from β-Diketonate Precursor," *Advanced Materials for Optics and Electronics*, vol. 4, (1994), pp. 389-400.

Morishita et al., "Atomic-layer Chemical-vapor-deposition of Silicon Nitride" Appl. Surf. Sci. 112, 198 (1997).

Nagel et al., "Modified chemical vapor deposition," Optical Fiber Communications: vol. 1 Fiber Fabrications, Ed. Tingye Li, Academic Press Inc., 1985, Chapter 1, pp. 1-64.

Nakano, M. et al., "Digital chemical vapor deposition of $SiO_2$," *Appl. Phys. Lett.*, vol. 57, No. 11, pp. 1096-1098 (1990).

NEC Device Technology International, No. 48, pp. 4-8 (1998).

Nelson, J.G., "Summary Abstract: Epitaxial Growth of ZnS and ZnSe on the Low Index Faces of GaAs Using Atomic Layer Epitaxy" J. Vac. Sci. Technol. A5, 2140 (1987).

Niinistö et al., "Synthesis of oxide thin films and overlayers by atomic layer epitaxy for advanced applications," *Materials Science & Engineering*, vol. B41, pp. 23-29 (1996).

Nishi et al., "In situ Optical Characterization of GaAs Surfaces under Alternating Supply of GaCl and $AsH_3$" Appl. Phys. Lett. 61,31 (1992).

Nishizawa et al., "Doping in Molecular Layer Epitaxy" J. Electrochem Soc. 136,478 (1989).

Nishizawa et al., "Gallium Arsenide Thin Films by Low-temperature Photochemical Processes" J. Vac. Sci. Technol. A5, 1572 (1987).

Nishizawa, J., "Molecular Layer Epitaxy and its Fundaments" J. Cryst. Growth 115, 12 (1991).

Nishizawa et al., "Molecular Layer Epitaxy of Silicon" J. Cryst. Growth 99, 502 (1990).

Nishizawa et al., "Silicon Molecular Layer Epitaxy" J. Electrochem. Soc. 137, 1898 (1990).

Ohno et al., "Atomic Layer Epitaxy of GaAs Using Triethylgallium and Arsine" Appl. Phys. Lett. 54, 2000 (1989).

Ohtsuka et al., "A New GaAs on Si Structure using AlAs Buffer Layers Grown by Atomic Layer Epitaxy" J.. Cryst. Growth 99, 346 (1990).

Ohtsuka et al., "Extremely High Be Doping of InGaAs by Low Temperature Atomic Layer Epitaxy" J. Cryst. Growth 115, 460 (1991).

Oikkonen, M., "Ellipsometric Studies of Zinc Sulfide Thin Films Grown by Atomic Layer Epitaxy" J. Appl, Phys. 62, 1385 (1987).

Oikkonen et al., "X-ray Diffraction Study of Microstructure in ZnS Thin Films Grown from Zinc Acetate by Atomic Layer Epitaxy" Thin Solid Films 124, 317 (1985).

Onda, N. et al., "Hydrogen Plasma Cleaning a Novel Process for IC-Packaging," p. 311, World Wide Web Address: Semiconductor Fabtech.com, 1998.

Ott et al., "Surface chemistry of $In_2O_3$ Deposition Using $In(CH_3)_3$ and $H_2O$ in a Binary Reaction Sequence" Appl. Surf. Sci. 112, 205 (1997).

Oya et al., "Growth of $\alpha-Al_2O_3$ Films by Molecular Layer Epitaxy" Appl, Phys. Lett. 51, 1143 (1987).

Ozeki et al., "Adsorption Mechanisms of Tertiarybutylarsine on Ga- and As-rich GaAs(001) Surfaces" Appl. Surf. Sci. 110 (1997) 112.

Ozeki et al., "New Approach to the Atomic Layer Epitaxy of GaAs Using a Fast Gas Stream" Appl. Phys. Lett. 53, 1509 (1988).

Pessa et al., "Atomic Layer Epitaxy and Characterization of CdTe Films Grown on CdTe (110) Substrates" J. Appl. Physics 54, 6047 (1983).

Pessa et al., "Atomic Layer Epitaxy of CdTe on the Polar (111)A and (111)B Surfaces of CdTe Substrates" J. Crst. Growth 67, 255 (1984).

Pessa et al., "Epitaxial Growth and Electronic Structure of CdTe Films" J. Vac. Sci. Technol. A2, 418 (1984).

Pessa et al., "Growth of $Cd_{1-x}Mn_xTe$ Films with 0<x<0.9 by Atomic Layer Epitaxy" Appl. Phys. Lett. 45, 646 (1984).

Pessa et al., "Characterization of Surface Exchange Reactions Used to Grow Compound Films" Appl. Phys. Lett. 38, 131 (1981).

Piner et al., "Effect of Hydrogen on the Indium Incorporation in in GaN Epitaxial Films" Appl. Phys. Lett. 70, 461 (1997).

Putkonen et al., "Low-temperature ALE deposition of $Y_2O_3$ thin films from βDikelonate precursors," *Chem. Vap. Deposition*, pp. 44-50, vol. 7 (2001).

Reid et al., "Role of trimethylgallium Exposure Time in Carbon Doping and High Temperature Atomic Layer Epitaxy of GaAs" Appl. Phys. Lett. 59, 2397 (1991).

Riihela et al., "Introducing Atomic Layer Epitaxy for the Deposition of Optical Thin Films" Thin Solid films, 289, 250 (1996).

Ritala et al. Chapter 2, "Atomic Layer Deposition"; Handbook of Thin Film Materials; vol. 1: Deposition and Processing of Thin Films; pp. 103-159 (2002).

Ritala et al., "Atomic Layer Epitaxy Growth of TiN Thin Films" J. Electrochem. Soc., 142,2731 (1995).

Ritala et al., "Atomic Layer Epitaxy Growth of TiN Thin Films from $TiI_4$ and $NH_3$" J. Electrochem. Soc., 145,2914 (1998).

Ritala et al., "Atomic Layer Epitaxy Growth of Titanium Dioxide Thin Films from Titanium Ethoxide," *Chem. Mater.*, vol. 6, pp. 556-561 (1994).

Ritala et al., "Effects of Intermediate Zinc pulses on Properties of TiN and NbN Films Deposited by Atomic Layer Epitaxy" Appl. Surf. Sci. 120, 199 (1997).

Ritala et al"Enhanced Growth Rate in Atomic Layer Epitaxy of Indium Oxide and Indium-Tin Oxide Thin Films," Electrochem. and Solid State Ltrs., 1, 156 (1998).

Ritala et al., "Growth of titanium dioxide thin films by atomic layer epitaxy," *Thin Solid Films*, vol. 225, pp. 288-295 (1993).

Ritala et al., "Surface Roughness Reduction in Atomic Layer Epitaxy Growth of Titanium Dioxide Thin Films" Thin Solid Films, 249, 155 (1994).

Ritala et al., "Titanium Isopropoxide as a Precursor in Atomic Layer Epitaxy of Titanium Dioxide Thin Films," *Chem. Mater.*, vol. 5, pp. 1174-1181 (1993).

Ritala et al., "Zirconium dioxide thin films deposited by ALE using zirconium tetrachloride as precursor," *Applied Surface Science*, vol. 75, (1994), pp. 333-340.

Sakaue, H. et al., "Digital Chemical Vapor Deposition of SiO2 Using a Repetitive Reaction of triethylsilane/Hydrogen and Oxidation," *Japanese Journal of Applied Physics*, vol. 30, No. 1B, pp. L124-L127 (1990).

Sakuma et al., "Atomic layer Epitaxy of GaP and Elucidation for Self-limiting Mechanism" Appl. Phys. Lett. 56, 827 (1990).

Sakuma et al., "Comparative Study of Self-limiting Growth of GaAs using Different Ga-alkyl Compounds: $(CH_3)_3Ga$, $C_2H_5(CH_3)_2Ga$, and $(C_2H_5)_3Ga$" J. Appl. Phys. 68, 5660 (1990).

Schulz et al., "MOCVD Routes to Thin Metal Oxide Films for Superconducting Electronics," Adv. Mater., vol. 6, No. 10, pp. 719-730 (1994).

Seim et al., "Deposition of $LaNiO_3$ thin films in an atomic layer epitaxy reactor," J. Mater. Chem., pp. 449-454, vol. 7 (1997).

Seim et al., "Growth of $LaCoO_3$ thin films from β-Dikelonate precursors," Appl. Surf. Science, pp. 243-250, vol. 112 (1997).

Seong et al., "Ferroelectric $SrBi_2Ta_2O_9$ Thin Film Deposition at 550° C. by Plasma-enhanced Metalorganic CVD onto a Metalorganic CVD Platinum Bottom Electrode", J. Vac. Sci. Technol. A17, 83 (1999).

Sheppard, "Advances in Processing of Ferroelectric Thin Films," Ceramic Bulletin, vol. 71, No. 1, (1992).

Shin et al., "Plasma-Enhanced Atomic Layer Deposition of $SrTa_2O_6$ and $SrBi_2Ta_2O_9$ Thin Films"; Atomic Layer Deposition (ALD 2002) Conference, Hanyang University, Seoul Korea, Aug. 19-21, pp. 1-18 (2002).

Singh et al., "Measurements of neutral and ion composition, neutral temperature, and electron energy distribution function in a CF4 inductively coupled plasma," J. Vacuum Science Technology A 19(3), May/Jun. 2001.

Singh et al., "Measurements of the electron energy distribution function in molecular gases in a shielded inductively coupled plasma," Journal of Applied Physics, vol. 88 (7), Oct. 1, 2000, pp. 3889-3898.

Skarp et al., ALE-reactor for Large Area, Appl. Surf. Sci. 112, 251 Depositions (1997).

Soininen et al., "Blue Electroluminescence of SrS:Ce, $SiCl_4$ Thin films Grown by Atomic Layer Epitaxy" Int. Display Res. Conf. Proceedings, Aug. 31-Sep. 3, 1993,p. 511.

SOI Technology: IBM's Next Advance in Chip Design. Date unknown, 1998.

Solanki, R. et al., "Atomic Layer Deposition of Copper Seed Layers," Electrochemical and Solid-State Letters, 2000, vol. 3, No. 10, pp. 479-480.

Suda et al., Thermal and Photostimulated Reactions on $Si_2H_6$-adsorbed Si(100)2x1 Surfaces: Mechanisms of Si Film Growth by Atomic Layer Epitaxy, J. Vac. Sci. Technol. B7, 1171 (1989).

Sugahara, S. et al., "Atomic hydrogen-assisted ALE of germanium," Applied Surface Science, vol. 90, pp. 349-356 (1995).

Sugahara, S. et al., "Atomic layer epitaxy of germanium," Applied Surface Science, vols. 82/83, pp. 380-386 (1994).

Sugahara, S. et al., "Modeling of germanium atomic-layer-epitaxy," Applied Surface Science, vol. 112, pp. 176-186 (1997).

Sugahara et al., "Modeling of Silicon Atomic-layer-epitaxy" Appl. Surf. Sci. 107, 161 (1996).

Sundani et al., "Oral presentation of dual damascene process," slides, 1998.

Suntola, "Atomic Layer Epitaxy," Thin Solid Films, vol. 216, pp. 84-89 (1992).

Suntola, "Atomic Layer Epitaxy," Handbook of Crystal Growth 3, Ch. 14, pp. 601-663 (1994).

Suntola, "Surface Chemistry of Materials Deposition at Atomic Layer Level" Appl. Surf. Sci. 100/101, 391 (1996).

Szczerbakow et al., "Monocrystalline ZnS-sphalerite Films Grown by Atomic Layer Epitaxy in a Gas Flow System" J. Cryst. Growth 183, 708 (1998).

Takahashi et al., "Self-limiting Adsorption of $SiCl_2H_2$ and its Application to the Layer-by-layer Photo-chemical process" Jpn. J. AppL Phys. 30, L-209 (1991).

Taki et al., "Atomic Layer Epitaxy of GaAs using GaBr and Gal Sources" Appl. Surf. Sci. 112, 127 (1997).

Tammenmaa et al., "Zinc Chalcogenide Thin Films Grown by Atomic Layer Epitaxy Technique Using Zinc Acetate as Source Material" Thin Solid Films 124, 125 (1985).

Tanninen et al., "Comparative Study of the Crystal Phase, Crystallite Size and Microstrain in Electroluminescent ZnS:Mn Films Grown by ALE and Electron Beam Evaporation" Thin Solid Films 109, 283 (1983).

Tanninen et al., "Structural Characterization of Thin ZnS Films by X-Ray Diffraction" Thin Solid Films 90, 339 (1982).

Tasch et al., "Atomic Layer Epitaxy of Germanium" J. Vac. Sci. Technol. 12A, 2265 (1994).

Thompson et al. "Use of Atomic Layer Epitaxy buffer for the Growth of InSb on GaAs by Molecular heam Epitaxy" J. Appl. Phys. 69, 7166 (1991).

Tin et al., "Guanidinate anions and dianions. Reactions involving alkylguanidines, $(RNH)_2CNR$ (R=i-Pr or Cy), and metal amido complexes $M(NMe_2)_5$ (M=Ta or Nb)," Journal of the Chemical Society, Dalton Transactions, 2947-1951 (1999).

Tischler et al., "Growth and Characterization of Compound Semiconductors by Atomic Layer Epitaxy" J. Cryst. Growth 77, 89 (1986).

Tischler et al., "Self-limiting Mechanism in the Atomic Layer Epitaxy of GaAs" Appl. Phys. Lett. 48, 1681 (1986).

Tsurumi et al., "Fabrication of Barium Titanate/Strontium Titanate Artificial Superlattice by Atomic Layer Epitaxy" Jpn. J. Appl. Phys. 33, 5192 (1994).

Usui et al., "Atomic Layer Epitaxy of III-V Compounds by Hydride VPE" Int. Symp. GaAs and related compounds, Las Vegas, NV, 1986, Int Phys. Cant Ser. No. 83:Chapter 3, p. 129.

Usui et al., "GaAs Atomic Layer Epitaxy by Hydride VPE" Jpn. J. Appl. Phys. 25, L212 (1986).

Utrianinen et al., "Controlled Electrical conductivity in $SnO_2$ thin films by oxygen or hydrocarbon assisted atomic layer epitaxy", Electrochem. Soc. 146, 189 (1999).

Utriainen, M. et al., "Studies of metallic thin film growth in an atomic layer epitaxy reactor using $M(acac)_2$ (M=Ni, Cul Pt) precursors," Applied Surface Science, 2000, vol. 157, pp. 151-158.

Utriainen, M. et al., "Studies of NiO thin film formation by atomic layer epitaxy," Materials Science & Engineering, 1998, vol. B54, pp. 98-103.

Vehkamäki et al., "Growth of $SrTiO_3$ and $BaTiO_3$ Tin Films by Atomic Layer Deposition," Electrochemical and Solid-State Letters, 2 (10) pp. 504-506 (1999).

Wasslen et al., "Synthesis and Thermolysis of Hafnium and Zirconium Guanidinates for Atomic Layer Deposition," Nov. 5, 2005; www.uwo.ca/chem/IDW/scientific/html.

Watanabe et al., "The Mechanism of Atomic Layer Epitaxy of GaAs using Trimethylgallium and Arsine" Vacuum 41, 965 (1990).

Williams et al. "Crystal Structure of $Bi(OCMe_2CH_2Ome)_3$ and Its Use in the MOCVD of $Bi_2O_3$", Chemical Vapor Deposition, pp. 205-206 (2001).

Winbond News Release, World Wide Web address: winbond.com (Dec. 13, 2000).

Wisotski et al., "Room-temperature Growth of $ZrO_2$ Thin Films using a novel hyperthermal oxygen-atom source", J. Vac. Sci. Technol. A17, 14 (1999).

Wojtczak et al., "A Review of Group 2 (Ca, Sr, Ba) Metal-Organic Compounds as Precursors for Chemical Vapor Deposition," Advances in Organometallic Chemistry, vol. 40, pp. 215-340 Academic Press (1996).

Won, Seok-Jun et al., "Conformal CVD-Ruthenium Process for MIM Capacitor in Giga-bit DRAMs," IEEE, IED 2000, 2000, Session 34.

Xu, P. et al., "A Breakthrough in Low-k Barrier/Etch Stop Films for Copper Damascene Applications," Semiconductor Fabtech, 2000, 11th Edition, p. 239.

Yagishita, T. et al., "Cleaning of Copper Surface Using Vapor-Phase Organic Acids," MRS Proceedings, vol. 766, MRS Spring 2003 Meeting, Apr. 21-25, 2003, Symposium E, Session E3, Paper E3.28.

Yamada et al., "Atomic layer Deposition of ZnO Transparent Conducting Oxides" Appl. Surf. Sci. 112, 216 (1997).

Yamaga et al., "Atomic Layer Epitaxy of ZnS by a New Gas Supplying System in Low-pressure Metalorganic Vapor Phase Epitaxy" .T. Cryst. Growth 117, 152 (1992).

Yamamoto et al., "Atomic Layer-by-layer Epitaxy of Oxide Superconductors by MOCVD" Appl. Surf. Sci. 112, 30 (1997).

Yao et al., "Growth process in Atomic Layer Epitaxy of Zn Chalcogenide Single Crystalline Films on (100) GaAs" Appl. Phys. Lett. 48, 160 (1986).

Yao et al., "Photoluminescence Properties of ZnSe Single Crystalline Films Grown by Atomic Layer Epitaxy" Appl. Phys. Lett. 48, 1615 (1986).

Yarmoff et al "Atomic Layer Epitaxy of Silicon by Dichlorosilane Studied with Core Level Spectroscopy" J. Vac. Sci. Technol. A10, 2303 (1992).

Yokoyama et al., "Atomic Layer Controlled Deposition of Silicon Nitride and an in situ Growth Observation by Infrared Reflection Absorption Spectroscopy" Appl. Surf. Sci. 112, 75 (1997).

Yokoyama et al., "Atomic Layer Epitaxy of GaAs using Nitrogen Carrier Gas" Appl. Phys, Lett. 59,2148 (1991).

Yoon, Dong-Soo et al., "Investigatin of $RuO_2$-Incorporated Pt Layer as a Bottom Electrode and Diffusion Barrier for High Epsilon Capacitor Applications," *Electrochemical and Solid-State Letters*, 2000, vol. 3, No. 8, pp. 373-376.

Yoon, Dong-Soo et al., "Tantalum-ruthenium dioxide as a diffusion barrier between Pt bottom electrode and $TiSi_2$ ohmic contact layer for high density capacitors," *Journal of Applied Physics*, 1999, vol. 86, No. 5, pp. 2544-2549.

Yoon, Y.-G. et al., 197th Meeting Program Information II, The Electrochemical Society, 197th Meeting—Toronto, Ontario, Canada, May 14-18, 2000, Program Information, I1—Rapid Thermal and Other Short-Time Processing Technologies I, Electronics Division/Dielectric Science and Technology Division/High Temperature Materials Division, 2000, Wednesday, May 17, 2000, New Applications of RTP, Co-Chairs: A. Fiory and D.-L Kwong, time 11:10 Abs#550, Title: Development of RTA Process for the Crystallization of a-Si Thin Film—Y.-G. Yoong, T.-K. Kim, K.-B. Kim J.-Y. Chio, B.-I Lee, and S.-K. Joo (Seoul National Univ.).

Yu et al., "Reaction of Trimethylgallium in the Atomic Layer Epitaxy of GaAs(100)" Appl. Phys. Lett. 55, 1011 (1989).

Yun et al, "Dependence of Atomic Layer Deposited $Al_2O_3$ Films Characteristics on Growth Temperature and Al Precursors of $Al(CH_3)_3$ and $AlCl_3$" J. Vac. Sci. Technol., A 15, 2993 (1997).

Yun et al. "Pentacene-Thin Film Transistors with $ZrO_2$ Gate Dielectric Layers Deposited by Plasma-Enhanced Atomic Layer Deposition," *Electrochemical and Solid-State Letters*, 10 (3), H90-H93 (2007).

Zhu et al., "Nitrogen Doping During Atomic Layer Epitaxial Growth of ZnSe" Appl. Phys. Lett. 67, 3927 (1995).

Alt, *J. of Organometallic Chemistry*, 391 (1990), p. 53-60 and English translation.

Niinisto, *J. of Applied Physics*, vol. 95, No. 1 (Jan. 2004), p. 84.

Putkonen, *J. Mater. Chem.*, vol. 11, 2001, p. 3141-3147.

\* cited by examiner

PLASMA-ENHANCED DEPOSITION PROCESS FOR FORMING A METAL OXIDE THIN FILM AND RELATED STRUCTURES

BACKGROUND OF THE INVENTION

1. Field

The invention relates to thin film deposition on a substrate. More particularly, the present invention relates to plasma-enhanced deposition processes and related structures.

2. Description of the Related Art

In manufacturing semiconductor devices, various processes have been developed to provide a high quality thin film on a substrate. Several methods have been used to form a thin film employing surface reactions on a semiconductor substrate. The methods include vacuum evaporation deposition, Molecular Beam Epitaxy (MBE), different variants of Chemical Vapor Deposition (CVD) (including low-pressure and organometallic CVD and plasma-enhanced CVD), and Atomic Layer Epitaxy (ALE). ALE has been studied extensively for semiconductor deposition and electroluminescent display applications, and has been more recently referred to as Atomic Layer Deposition (ALD) for the deposition of a variety of materials.

Deposition processes continue to be developed as new needs and applications arise. For example, high k dielectric layers are increasingly prevalent in certain electronic devices or components, such as advanced Metal-Insulator-Metal (MIM) capacitors, silicon and organic thin film transistors, DRAMs, non-volatile memories, and organic light emitting diodes (OLEDs). Such electronic devices or components may also include layers and substrates sensitive to deposition conditions for forming high k dielectric layers. Thus, there is an on-going need to develop processes to form thin film with desired properties for various applications.

SUMMARY OF THE INVENTION

According to one embodiment, a method of forming a metal oxide thin film over a substrate includes conducting a deposition cycle. The deposition cycle includes supplying oxygen gas and an inert gas into a reaction space substantially continuously during the cycle, wherein a substrate is disposed in the reaction space. The deposition cycle also includes supplying a metal precursor into the reaction space. The metal precursor includes a cyclopentadienyl compound of the metal. The deposition cycle further includes activating the oxygen gas to expose the substrate to plasma-excited oxygen species in the reaction space.

According to another embodiment, a method of making an integrated circuit device includes loading a substrate into a reaction space; and conducting a plurality of deposition cycles at a temperature of about 200° C. or less to form a layer. Each cycle includes: supplying oxygen gas substantially continuously into the reaction space during the cycle; and supplying a metal precursor into the reaction space for a first duration. The first duration lasts less than an entirety of the cycle. The metal precursor includes a cyclopentadienyl compound of the metal. The layer is deposited at a growth rate of about 0.80 Å/cycle or greater. The deposited layer has a thickness uniformity of about 1.0 σ or less.

According to yet another embodiment, an integrated circuit device includes a substrate; and a metal oxide film formed over the substrate. The metal oxide film is made by the method described above.

Other embodiments of the present invention will be readily apparent to those skilled in the art from the following detailed description of some embodiments and with reference to the attached figures, the invention not being limited to any of the particular embodiments disclosed.

BRIEF DESCRIPTION OF THE DRAWINGS

The invention will be better understood from the Detailed Description of Some Embodiments and from the appended drawings, which are meant to illustrate and not to limit the invention.

DETAILED DESCRIPTION OF SOME EMBODIMENTS

In certain instances, metal oxide films are formed on a partially fabricated device including a structure formed of a material that has physical and/or chemical properties that are unstable at a relatively high temperature (e.g., a temperature over about 200° C.). Examples of such a material include, but are not limited to, low-k dielectric materials, organic semiconductor materials, and organic light emitting materials. Thus, there is a need for a process that can form a metal oxide film at a relatively low temperature that does not adversely affect such a material. In addition, there is a need for providing a high throughput process even at such a relatively low temperature.

In one embodiment, a deposition process of forming a metal oxide film includes a plurality of cycles conducted at a relatively low deposition temperature. In some embodiments, the temperature can be below about 250° C. or 200° C. During each cycle, oxygen gas and an inert carrier gas (e.g., Ar) are continuously supplied to a reactor. Each cycle includes steps of (1) supplying a metal precursor to the reactor; (2) purging excess precursor and/or by-products from the reactor; (3) applying RF power to the oxygen gas to generate oxygen plasma or radicals; and (4) purging excess oxygen plasma and/or radicals and by-products from the reactor.

The metal precursor is a cyclopentadienyl compound which does not readily react with oxygen gas at the deposition temperature. Thus, unwanted reaction by-products are not produced despite the metal precursor and oxygen gas co-existing in the reactor during the step (2). In addition, the durations of the purging steps (2) and (4) can be significantly reduced without adversely affecting the growth rate of the film, thereby enhancing the throughput. Because the process can be conducted at a low temperature, below about 250° C. in some embodiments, it can avoid damage to thermally unstable materials in the partially fabricated device.

Definitions

In the context of this document, "an ALD process" generally refers to a process for producing thin films over a substrate molecular layer by molecular layer using self-saturating chemical reactions. The general principles of ALD are disclosed, e.g., in U.S. Pat. Nos. 4,058,430 and 5,711,811. In a typical ALD process, gaseous reactants are introduced into a reaction chamber (or reaction space) of an ALD type reactor where they contact a substrate located in the chamber to provide a surface reaction. The pressure and the temperature of the reaction chamber are adjusted to a range where physisorption (i.e., condensation of gases) and thermal decomposition of the precursors are avoided. In addition, reactants that do not react with themselves are selected. Consequently, only up to one monolayer (i.e., an atomic layer or a molecular layer) of material is deposited at a time during each pulsing cycle. The actual growth rate of the thin film, which is typically presented as Å/pulsing cycle, depends, for example, on the number of available reactive surface sites and the bulkiness of the reactant molecules. That is, once all available binding sites are filled, no additional surface reactions are possible. Gas phase reactions between precursors and any undesired reactions of by-products are inhibited because reactant pulses are separated from each other by time and the reaction chamber is purged with an inert gas (e.g., nitrogen, argon, or helium) and/or evacuated, e.g., using a vacuum pump, between reactant pulses to remove surplus (or excess) gaseous reactants and reaction by-products, if any.

"Reaction space" is used to designate a reactor or reaction chamber, or an arbitrarily defined volume therein, in which conditions can be adjusted to effect thin film growth over a substrate by ALD. Typically the reaction space includes surfaces subject to all reaction gas pulses from which gases or particles can flow to the substrate, by entrained flow or diffusion, during normal operation. The reaction space can be, for example, the reaction chamber in a single-wafer ALD reactor or the reaction chamber of a batch ALD reactor, where deposition on multiple substrates takes place at the same time. The reactor is preferably configured for plasma generation, either in situ or remotely.

"Plasma-excited species" or "plasma" refers to radicals, ions or other excited species generated via application (or coupling) of energy to a reactant gas. Energy may be applied via a variety of methods, such as, e.g., induction, ultraviolet radiation, microwaves, radio frequency (RF) power application, and capacitive coupling. The plasma generator may be a direct plasma generator (i.e., in situ or direct plasma generation) or a remote plasma generator (i.e., ex situ or remote plasma generation). In the absence of coupling energy, plasma generation is terminated. Plasma-excited species include, without limitation, oxygen radicals. For in situ plasma generation, plasma-excited species of a particular vapor phase chemical (e.g., $O_2$) are formed in a reaction space comprising a substrate to be processed. For remote plasma generation, plasma-excited species are formed external to the reaction space including the substrate.

"Adsorption" is used to designate a physical and/or chemical attachment of atoms or molecules on a surface.

"Substrate" is used to designate any workpiece on which deposition is desired. Typical substrates can include, without limitation, silicon, silica, coated silicon, copper metal and nitride.

"Surface" is used to designate a boundary between the reaction space and a feature of the substrate.

"Thin film" means a film that is grown from elements or compounds that are transported as separate ions, atoms or molecules via vacuum, gaseous phase or liquid phase from the source to the substrate. The thickness of the film depends upon the application and may vary in a wide range, preferably from one atomic layer to 1,000 nm or more. In some embodiments, the thin film is less than about 20 nm in thickness, less than about 10 nm or less than about 5 nm.

Low-Temperature Process for Forming a Metal Oxide Film Deposition System

Figure 1:
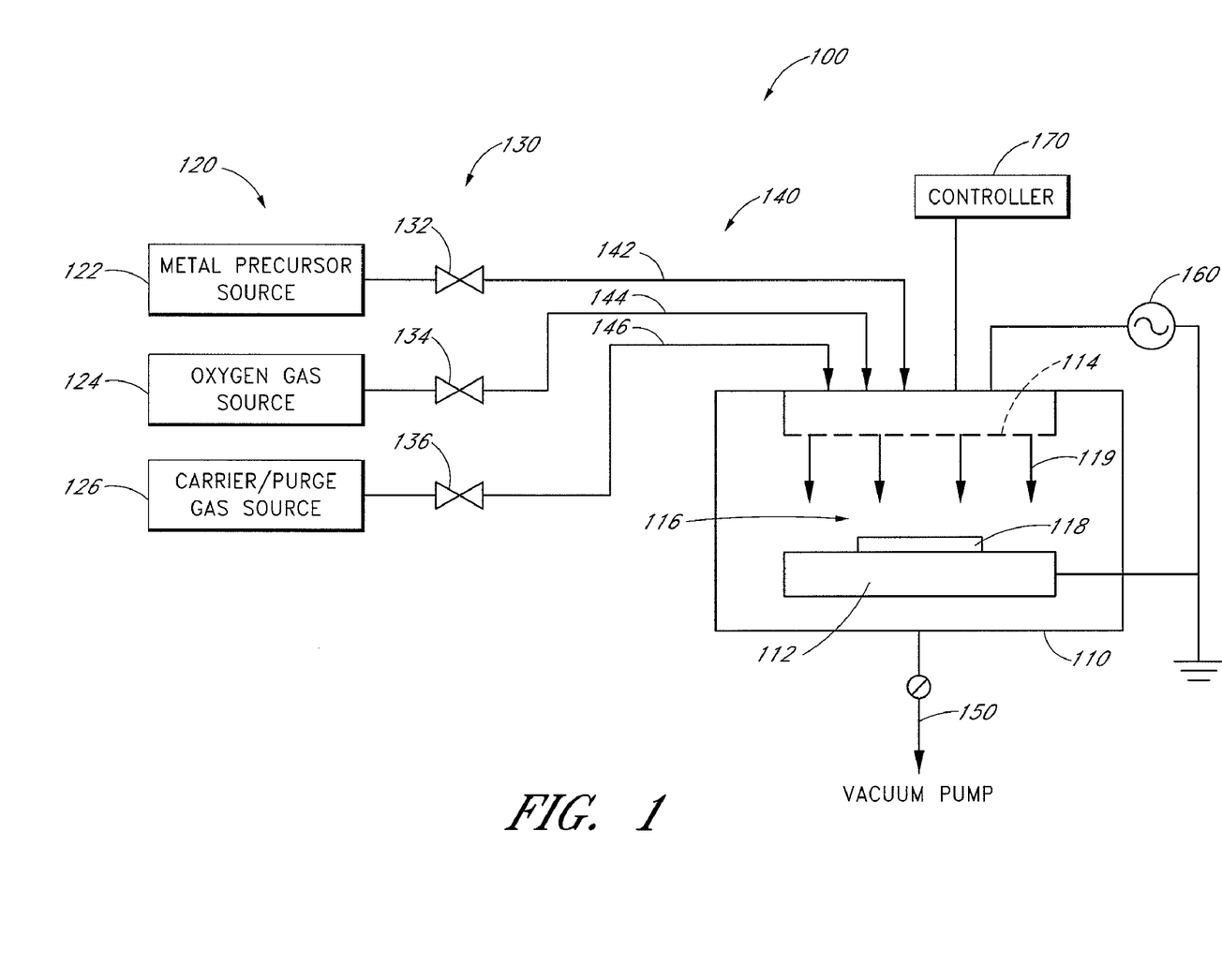
FIG. 1 is a schematic diagram of a plasma-enhanced atomic layer deposition (PEALD) system according to some embodiments of the invention.

In one embodiment, a low-temperature deposition process according to embodiments of the invention can be carried out in a plasma-enhanced atomic layer deposition (PEALD) system 100 shown in FIG. 1. A skilled artisan will, however, appreciate that other types of deposition systems can be adapted for the deposition process. The illustrated system 100 includes a reactor 110, gas sources 120, valves 130, gas supply lines 140, a gas exhaust line 150, a radio frequency (RF) power source 160, and a controller 170.

The reactor 110 includes a substrate holder or susceptor 112 and a showerhead plate 114. The substrate holder 112, the showerhead plate 114, and inner walls of the reactor 110 together define a reaction space 116 in which a substrate 118 is processed. The showerhead plate 114 is positioned over the substrate holder 112 with a plurality of openings facing the substrate holder 112. The substrate holder 112 is configured to support the substrate 118 during a deposition process. In the illustrated embodiment, a substantially vertical flow 119 of gases is generated over the substrate 118 within the reaction space 116 by the showerhead plate 114. In other embodiments, a reactor may be configured to generate a horizontal or laminar flow over a substrate. A skilled artisan will appreciate that various configurations of reactors can be adapted for deposition processes which will be described below.

The gas sources 120 include a metal precursor source 122, an oxygen gas source 124, and a purge or carrier gas source 126. Each of the gas sources 122, 124, 126 is in fluid communication with the reactor 110 via a respective one of the gas supply lines 142, 144, 146. In addition, each of the gas supply lines 142, 144, 146 is provided with a valve 132, 134, or 136 for controlling the flow rate of the gas supplied to the reactor 110.

The gas exhaust line 150 is configured to exhaust gases from the reactor 110. In the illustrated embodiment, the gas exhaust line 150 is connected to a vacuum pump for facilitating exhausting gases from the reactor 110.

The RF power source 160 applies RF power to the reaction space 116 so as to generate plasma. In the illustrated embodiment, RF power can be applied to the reaction space 116 by turning on the RF power source 160. In another embodiment, while the RF power source 160 is kept on during the deposition process, a switch may be used to make electrical connection or disconnection between the RF power source 160 and the reaction space 116.

In the illustrated embodiment, a positive electrode (not shown) is in electrical contact with the showerhead plate 114. A negative electrode is in electrical contact with the substrate holder 112, and is grounded. Plasma is generated between the showerhead plate 114 and the substrate 118 when a gas is introduced into the reactor 110 and RF power is applied to the reactor 110 through the electrodes. Factors affecting plasma generation include, without limitation, RF power on time, RF power amplitude, RF power frequency, reactant concentration, reactant flow rate, reaction space pressure, total gas flow rate, reactant pulse durations and separations, and RF electrode spacing.

The controller 170 controls the components of the PEALD system 100. For example, the controller 170 may be programmed to control the valves 130 to supply predetermined amounts of gases required for a deposition recipe in a timely manner. The controller 170 may also control the RF power source to apply RF power to the reactor in a timely manner. In addition, the controller 170 may control the exhaust line 150 and the vacuum pump in a timely manner to regulate the exhaust of gases out of the reaction space 116. The controller 170 may also control substrate loading/unloading operations for the reactor 110. The controller 170 may be a general purpose computer or a customized microprocessor programmed to control various parts of the PEALD system 100. The controller 170 may also include other peripheral components such as a memory and a user interface. A skilled artisan will appreciate that various configurations of controllers can be used for the PEALD system 100.

Low Temperature Deposition Process

Figure 2:
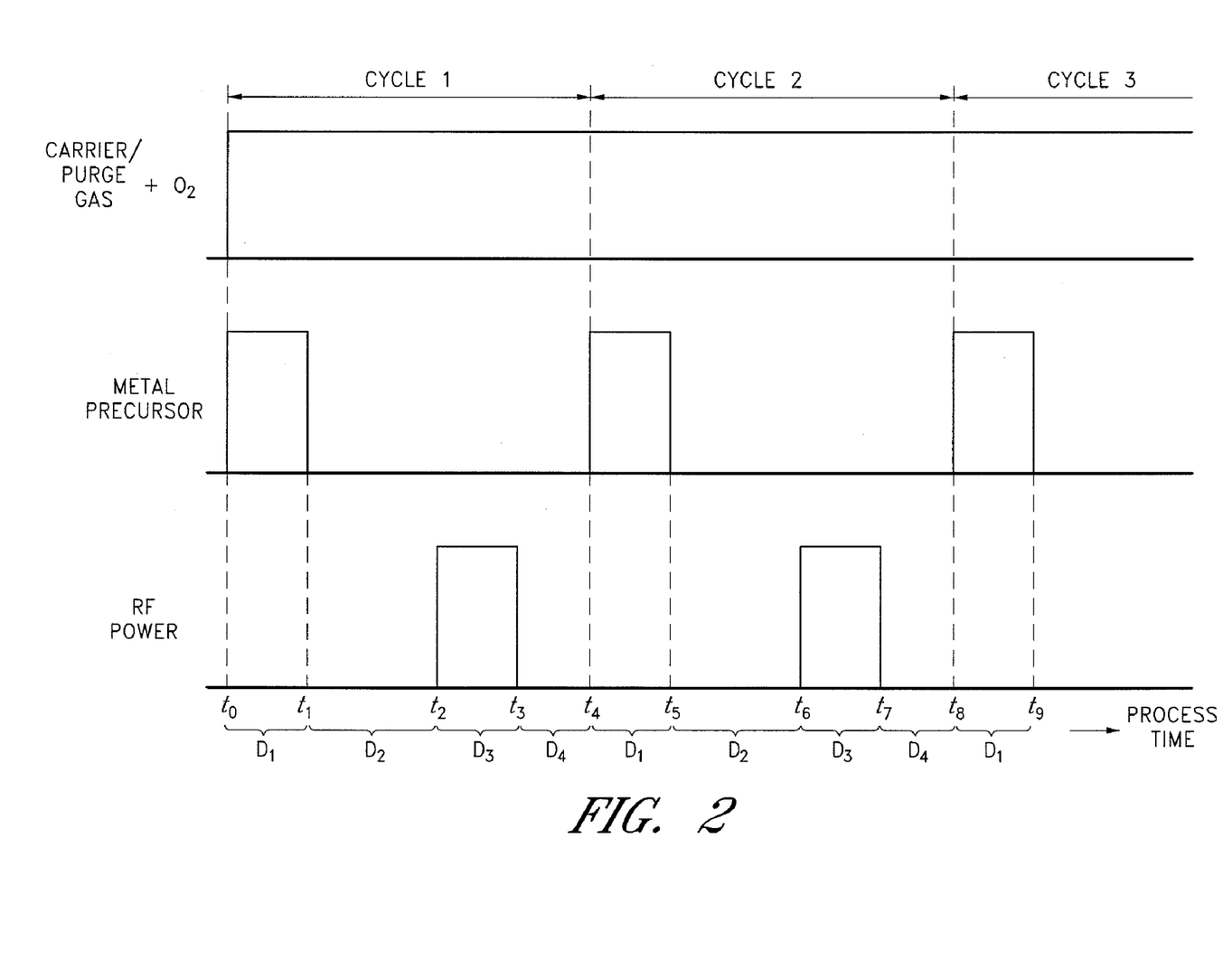
FIG. 2 is a timing diagram illustrating a PEALD process of forming a metal oxide thin film according to some embodiments of the invention.

Referring to FIGS. 1 and 2, a deposition process for forming a metal oxide thin film according to one embodiment will now be described. The deposition process is preferably a PEALD process. Examples of metal oxides that can be formed using the PEALD process include, but are not limited to, the oxides of Zr, Sc, La, Ce, Pr, Nd, Sm, Eu, Gd, Th, Dy, Ho, Er, Tm, Yb, Lu, Sr, Ba, Hf, Ta, Y, Ti, and Nb.

In some embodiments, the process includes performing a plurality of deposition cycles. In the illustrated embodiment, a first cycle, CYCLE 1, starts at time t0, and ends at time t4. A second cycle, CYCLE 2, subsequently starts at time t4 and ends at time t8. A third cycle, CYCLE 3, starts at t8 and continues thereafter in the same manner as the first and second cycles. The duration of each of the cycles may be from about 400 milliseconds (ms) to about 8000 milliseconds. The plurality of cycles can be conducted at a temperature of about 400° C. or less, about 275° C. or less, or about 175° C. or less.

The number of deposition cycles can be selected primarily based on a desired thickness of a film formed by the deposition process. A skilled artisan will appreciate that the number of cycles may vary widely depending on the types of reactants used and the reaction conditions, such as reaction temperature, reaction pressure, and RF power and frequency.

During each cycle, oxygen gas and an inert purge or carrier gas are continuously supplied to the reactor. Each cycle can also include the steps of (1) supplying a metal precursor to a reactor; (2) purging excess precursor and/or by-products from the reactor; (3) applying RF power to the reactor to generate oxygen plasma or radicals; and (4) purging excess oxygen plasma and/or radicals and by-products from the reactor. In certain embodiments, the purge steps (2) and (4) can be omitted.

As described above, each cycle includes supplying oxygen gas and a carrier gas from the oxygen gas source 124 and the carrier gas source 126, respectively, into the reaction space 116 (see FIG. 1). In one embodiment, the carrier gas may be argon (Ar) gas. Argon gas may facilitate generation of plasma during the step (3). Other examples of carrier gases include, but are not limited to, nitrogen ($N_2$) gas, helium (He) gas, and/or other inert gases.

The oxygen gas and carrier gas may be continuously supplied to the reaction space 116 throughout the cycle. In the illustrated embodiment, a total flow rate of the carrier gas and the oxygen gas is substantially constant throughout the cycle. In addition, the flow rate of each of the carrier gas and the oxygen gas may be constant throughout the cycle. In one embodiment, the carrier gas may be supplied at a flow rate of about 200 sccm to about 1,200 sccm, or about 400 sccm to about 600 sccm, throughout the cycle. The oxygen gas may be supplied at a flow rate of about 20 sccm to about 200 sccm, or about 110 sccm to about 130 sccm, throughout the cycle. In another embodiment, the flow rate of each of the carrier gas and the oxygen gas may be varied while maintaining the total flow rate constant.

In certain embodiments, only one of the oxygen gas and carrier gas may be supplied at a substantially constant flow rate to the reaction space 116. In such embodiments, a total flow rate of the carrier gas and the oxygen gas may be varied depending on the steps of the cycle. A skilled artisan will appreciate that the flow rates of the carrier gas and oxygen gas can be varied widely depending on the ALD recipes.

Each cycle also includes supplying a metal precursor from the metal precursor source 122 into the reaction space 116. The metal precursor is selected based on the metal oxide film to be formed on the substrate 118. In one embodiment, the metal precursor used in the deposition process is a cyclopentadienyl compound of the metal. The cyclopentadienyl compound may be a bis-cyclopentadienyl compound represented by Formula 1:

$$(R^1Cp)_2MR^2R^3 \qquad \text{Formula 1}$$

In Formula 1, Cp is a cyclopentadienyl ligand. M is a metal selected from Zr, Sc, La, Ce, Pr, Nd, Sm, Eu, Gd, Th, Dy, Ho, Er, Tm, Yb, Lu, Sr, Ba, Hf, Ta, Y, Ti, and Nb. $R^1$ is hydrogen, a C5-C6 alkyl group, a C5-C6 alkoxy group, or an amido group. $R^2$ and $R^3$ are the same as or different from each other and/or $R^1$, and are a C5-C6 alkyl group, a C5-C6 alkoxy group, or an amido group.

In another embodiment, the cyclopentadienyl compound may be a mono-cyclopentadienyl compound represented by Formula 2:

$$(R^1Cp)MR^2R^3R^4 \qquad \text{Formula 2}$$

In Formula 2, Cp is a cyclopentadienyl ligand. M is a metal selected from Zr, Sc, La, Ce, Pr, Nd, Sm, Eu, Gd, Th, Dy, Ho, Er, Tm, Yb, Lu, Sr, Ba, Hf, Ta, Y, Ti, and Nb. $R^1$ is hydrogen, a C5-C6 alkyl group, a C5-C6 alkoxy group, or an amido group. $R^2$, $R^3$, and $R^4$ are the same as or different from one another and/or $R^1$, and are C5-C6 alkyl groups, C5-C6 alkoxy groups, or amido groups.

In the illustrated embodiment, the metal precursor is supplied for a duration D1 between time t0 and time t1 in the first cycle, CYCLE 1. The duration D1 may be from about 300 milliseconds to about 1500 milliseconds. The metal precursor may be supplied in a carrier flow rate of about 200 sccm to about 1,200 sccm.

Each cycle can also include a first purge step for a duration D2 between time t1 and time t2. As illustrated, the purge can entail flowing the carrier gas and $O_2$ without flowing the metal precursor or turning on the plasma power. The length of the duration D2 can be selected such that excess metal precursor and/or reaction by-products are sufficiently purged from the reaction space 116 to prevent undesired reactions. In one embodiment, the duration D2 is about 0 milliseconds to about 5,000 milliseconds. A skilled artisan will appreciate that the duration D2 can be varied depending on, for example, the design of the exhaust line 150 and the pressure in the reaction space 116.

Each cycle further includes applying RF power to the reaction space 116 for a duration D3 between time t2 and time t3. The RF power can be applied to the reaction space 116 by turning on the RF power source 160. In one embodiment, RF power can be maintained between about 75 W and about 200 W. The properties of the resulting film can be varied by adjusting the strength and duration of the RF power. Particularly, in a process using a low temperature (e.g., a temperature below about 150° C.), the greater the RF power is, the better the film thickness uniformity and/or crystallinity are. The duration D3 may be from about 200 milliseconds to about 2,000 milliseconds. A skilled artisan will, however, appreciate that the duration D3 can be varied widely depending on the plasma generation conditions such as RF power strength, RF power frequency, reactant concentration, reactant flow rate, reaction space pressure, total gas flow rate, reactant pulse durations and separations, and RF electrode spacing.

Each cycle also includes a second purge step for a duration D4 between time t3 and time t4. The length of the duration D4 can be selected such that excess plasma and/or reaction by-products are sufficiently removed from the reaction space 116 to prevent undesired reactions. In one embodiment, the duration D4 is about 0 milliseconds to about 2,000 milliseconds. A skilled artisan will appreciate that the duration D4 can be varied depending on, for example, the design of the exhaust line 150 and the pressure in the reaction space 116.

In some embodiments, the deposition process may be carried out while maintaining the temperature of the reaction space 116 at about 110° C. to about 150° C. The temperature of the reaction space 116 is reactor design-dependent, and may be much higher than 150° C. as long as the temperature is below the decomposition temperature of the precursor(s).

The temperature of the supply line 142 from the metal precursor source 122 to the reactor 110 may be from about 100° C. to about 200° C. The temperature of the supply line 142 can vary depending on the vessel temperature and decomposition temperature for the precursor. In certain embodiments, the lower limit of the supply line temperature is about 5° C. to 10° C. higher than the vessel temperature, and the upper limit of the supply line temperature is at least 10° C. lower than the decomposition temperature. The temperature of the substrate holder 112 may be from about 100° C. to about 400° C., from about 100° C. to about 250° C., or from about 150° C. to about 200° C.

Pressure in the reaction space 116 during the deposition process may be from about 2 torr to about 10 torr in some embodiments. In other embodiments, the pressure in the reaction space 116 may be from about 6 torr to about 8 torr. The reaction space pressure can vary depending on the reactor design.

Effect of Temperature on Film Growth and Properties

Figure 3:
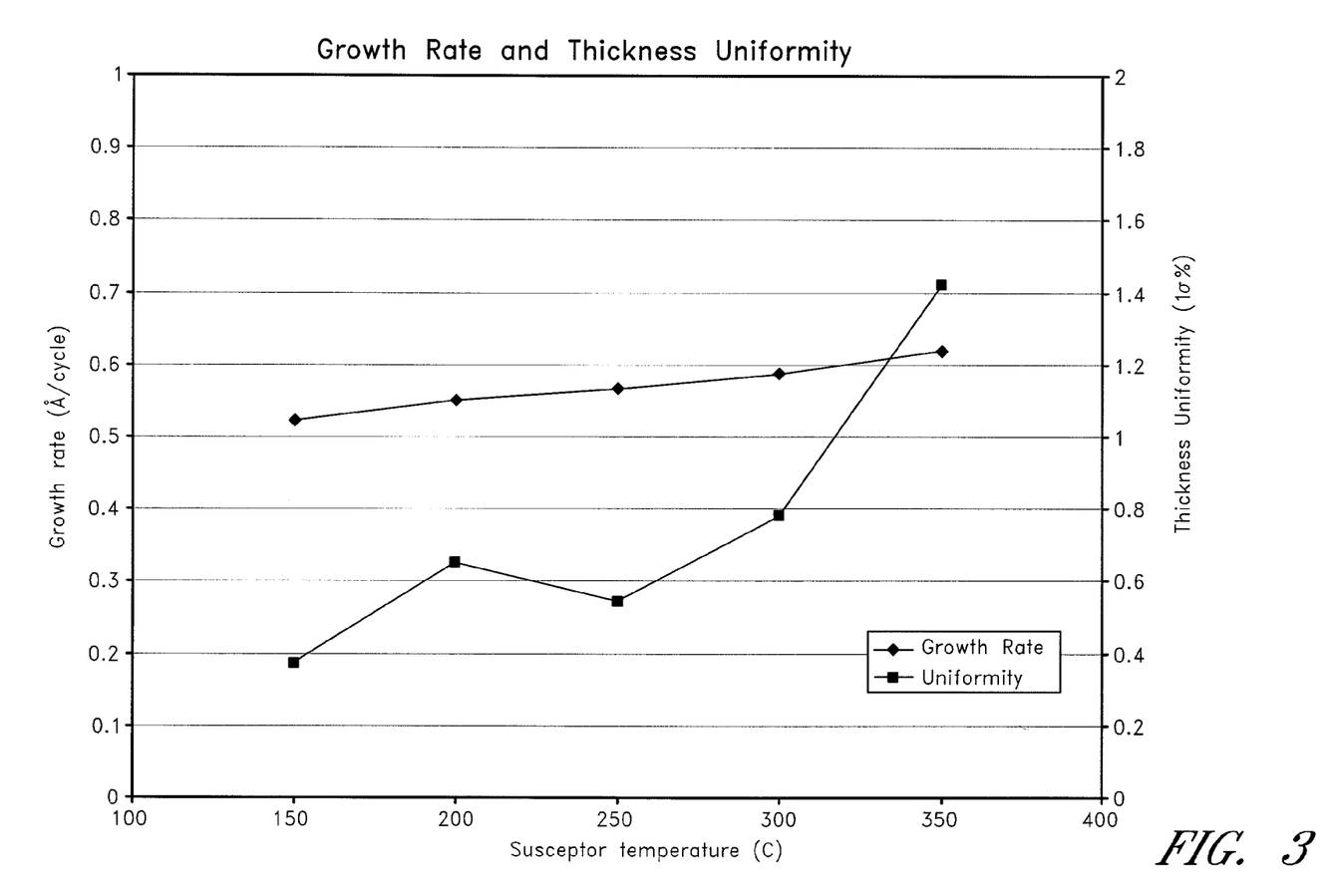
FIG. 3 is a graph illustrating the relationship between the film growth rate/thickness uniformity of a zirconium oxide thin film and reaction temperature in a PEALD process according to some embodiments of the invention.

FIG. 3 shows a relationship between the susceptor temperature in the deposition process described above and the growth rate/thickness uniformity of the deposited film. Depositions were conducted to form zirconium oxide ($ZrO_2$) thin films on 300-mm wafers in a PEALD reactor according to the deposition process described above. The depositions were conducted while varying the susceptor temperature. In FIG. 3, a symbol "σ" (sigma) represents standard deviation with respect to the thickness of a deposited film. Decreasing the susceptor temperature was not found to significantly adversely affect the growth rate of the film and the growth rate decreased when the temperature was decreased from 250° C. to 150° C. The thickness uniformity of the film was enhanced as the temperature was decreased. In addition, the resulting zirconium oxide films were found to have a k value of 35 or higher.

Effects of Step Durations on Film Growth and Thickness Uniformity

FIGS. 4-7 show relationships between the durations of the steps (1) to (4) of the deposition process described above and the growth rate/thickness uniformity of the deposited film. Depositions were conducted to form zirconium oxide ($ZrO_2$) thin films on 300-mm wafers in a PEALD reactor according to the deposition process described above. The depositions were conducted at a reactor temperature of 110° C. and a substrate temperature of about 250° C. 120 sccm of oxygen gas was continuously supplied to the reactor. In FIGS. 4-7, a symbol "σ" (sigma) represents standard deviation with respect to the thickness of a deposited film.

Figure 4:
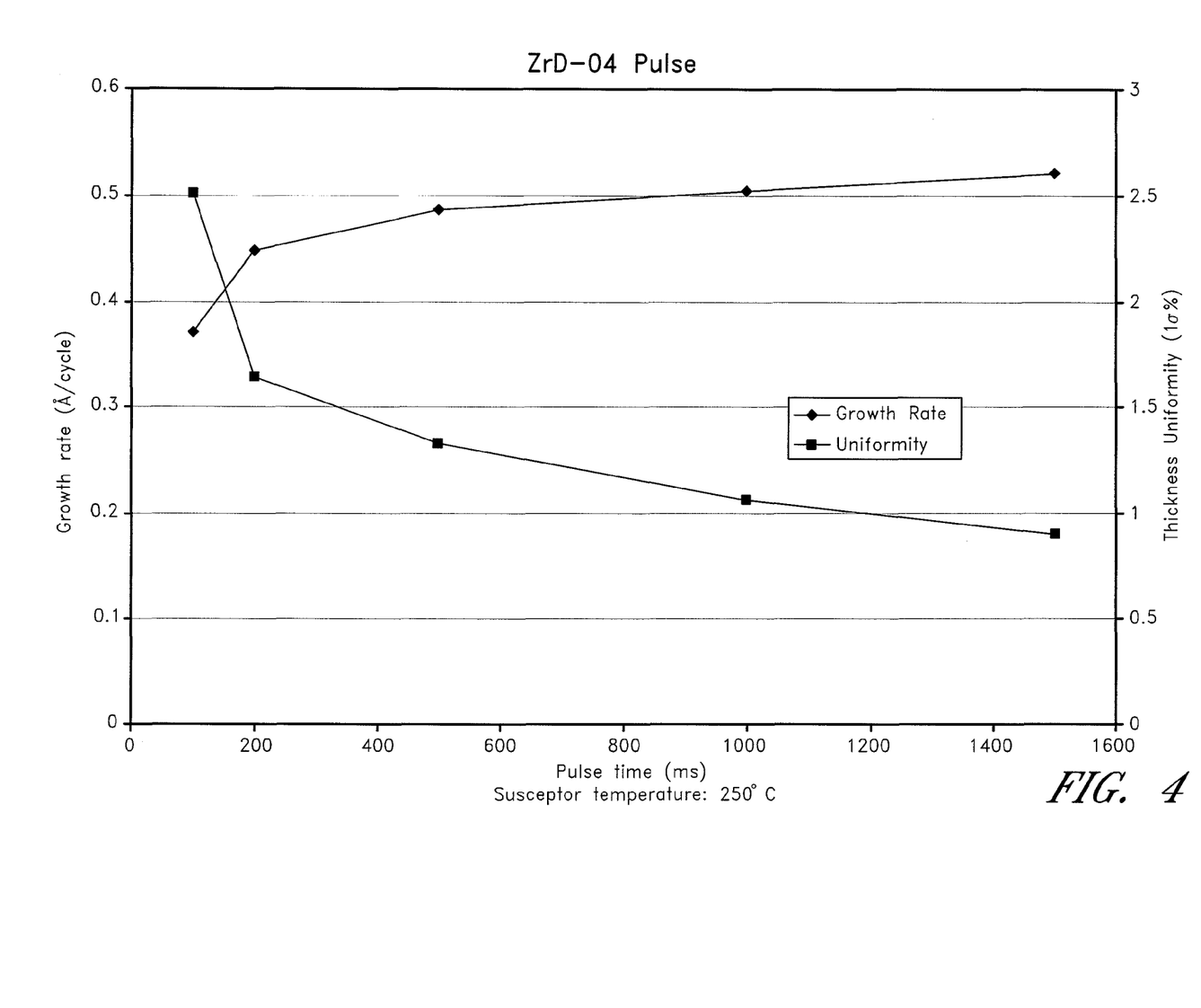
FIG. 4 is a graph illustrating the relationship between the film growth rate/thickness uniformity of a zirconium oxide thin film and the supply duration of a zirconium precursor in a PEALD process according to some embodiments of the invention.
Figure 5:
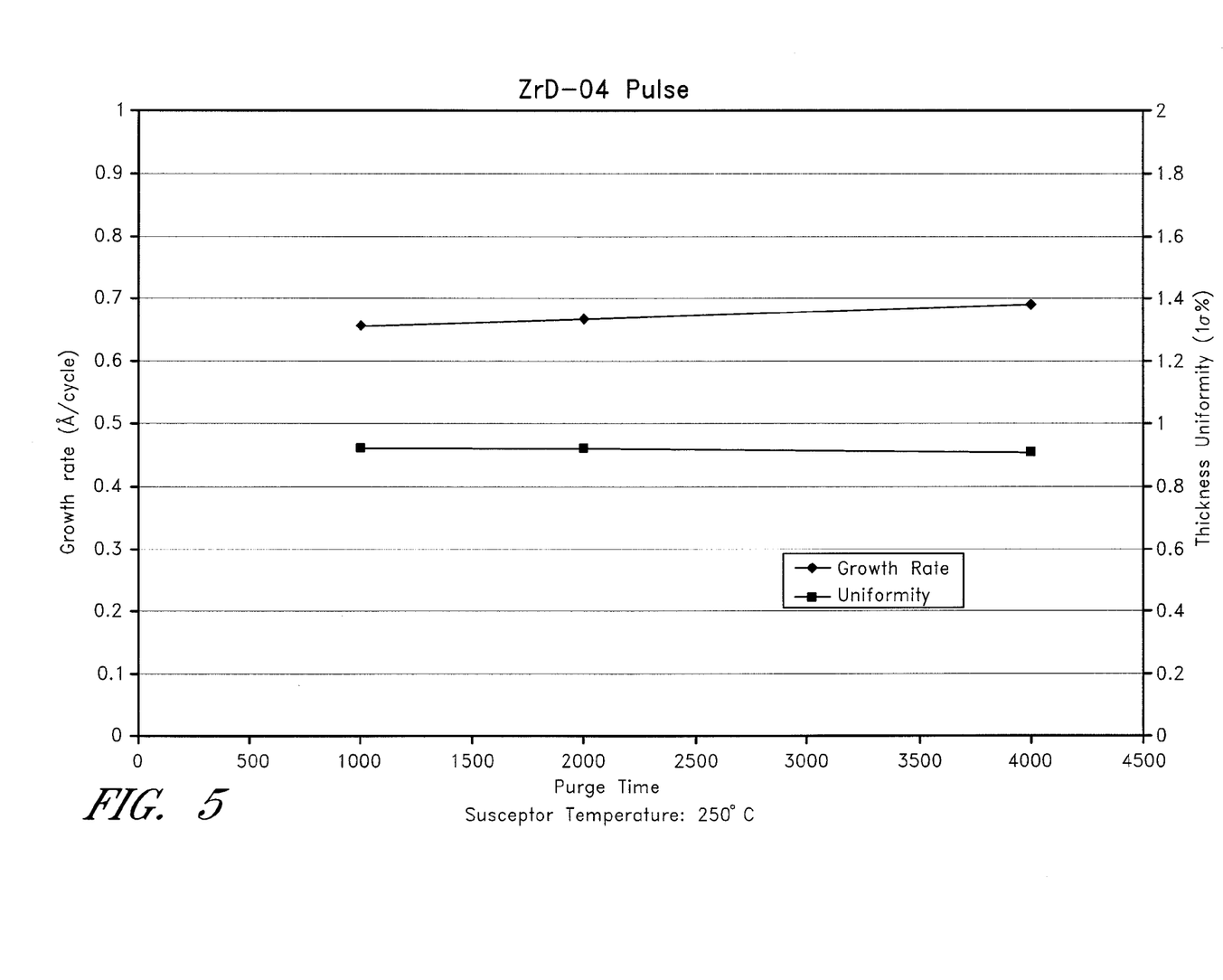
FIG. 5 is a graph illustrating the relationship between the film growth rate/thickness uniformity of a zirconium oxide thin film and the purge duration of a zirconium precursor in a PEALD process according to some embodiments of the invention.

Decreasing the supply duration D1 (FIG. 2) of a zirconium precursor was not found to significantly adversely affect the growth rate and thickness uniformity of the film (see FIG. 4). In addition, decreasing the duration D2 (FIG. 2) of purging the zirconium precursor did not adversely affect the growth rate and thickness uniformity of the film (see FIG. 5). As the duration D2 of the purge was decreased to 0, the growth rate increased.

Figure 6:
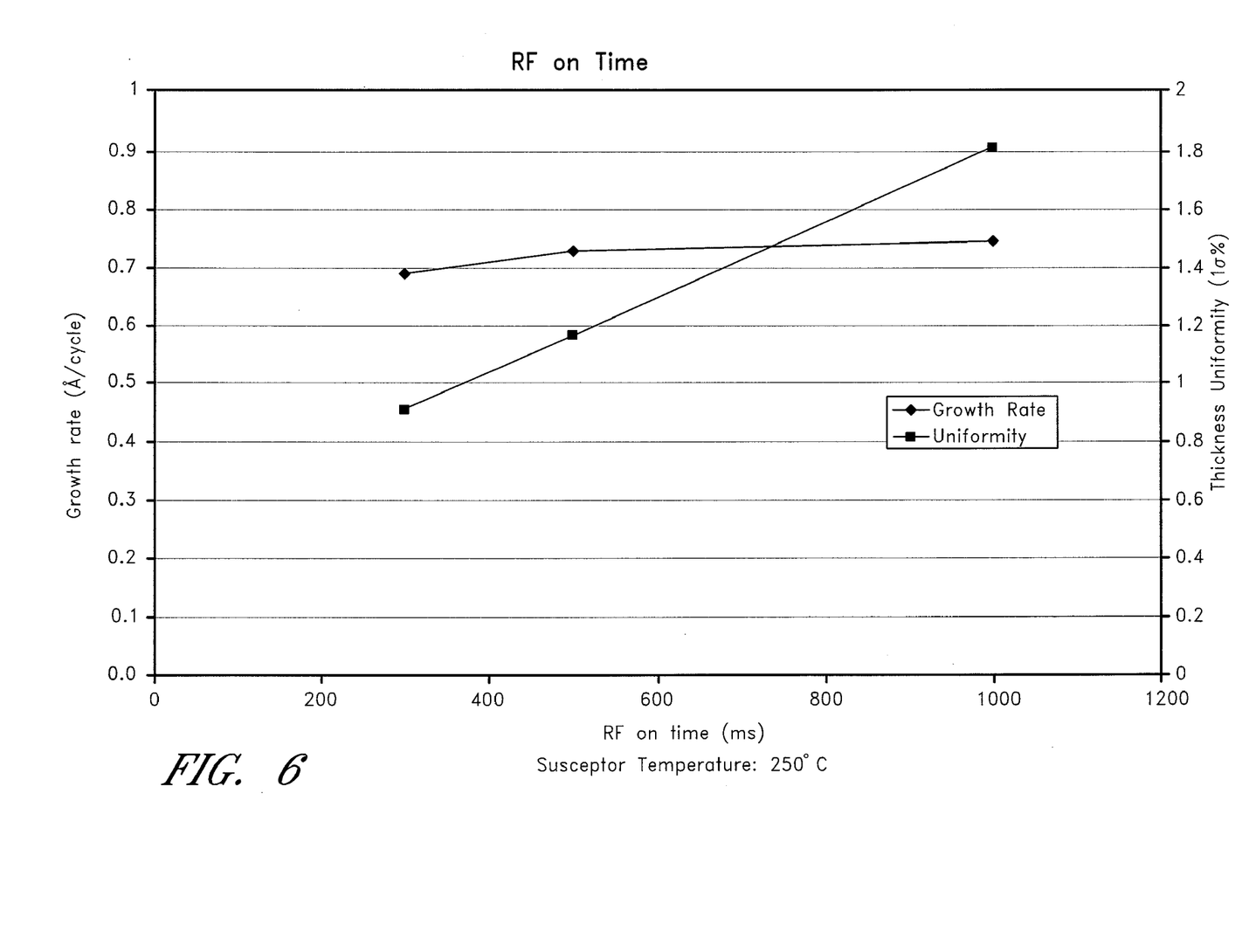
FIG. 6 is a graph illustrating the relationship between the film growth rate/thickness uniformity of a zirconium oxide thin film and the duration of RF power application in a PEALD process according to some embodiments of the invention.
Figure 7:
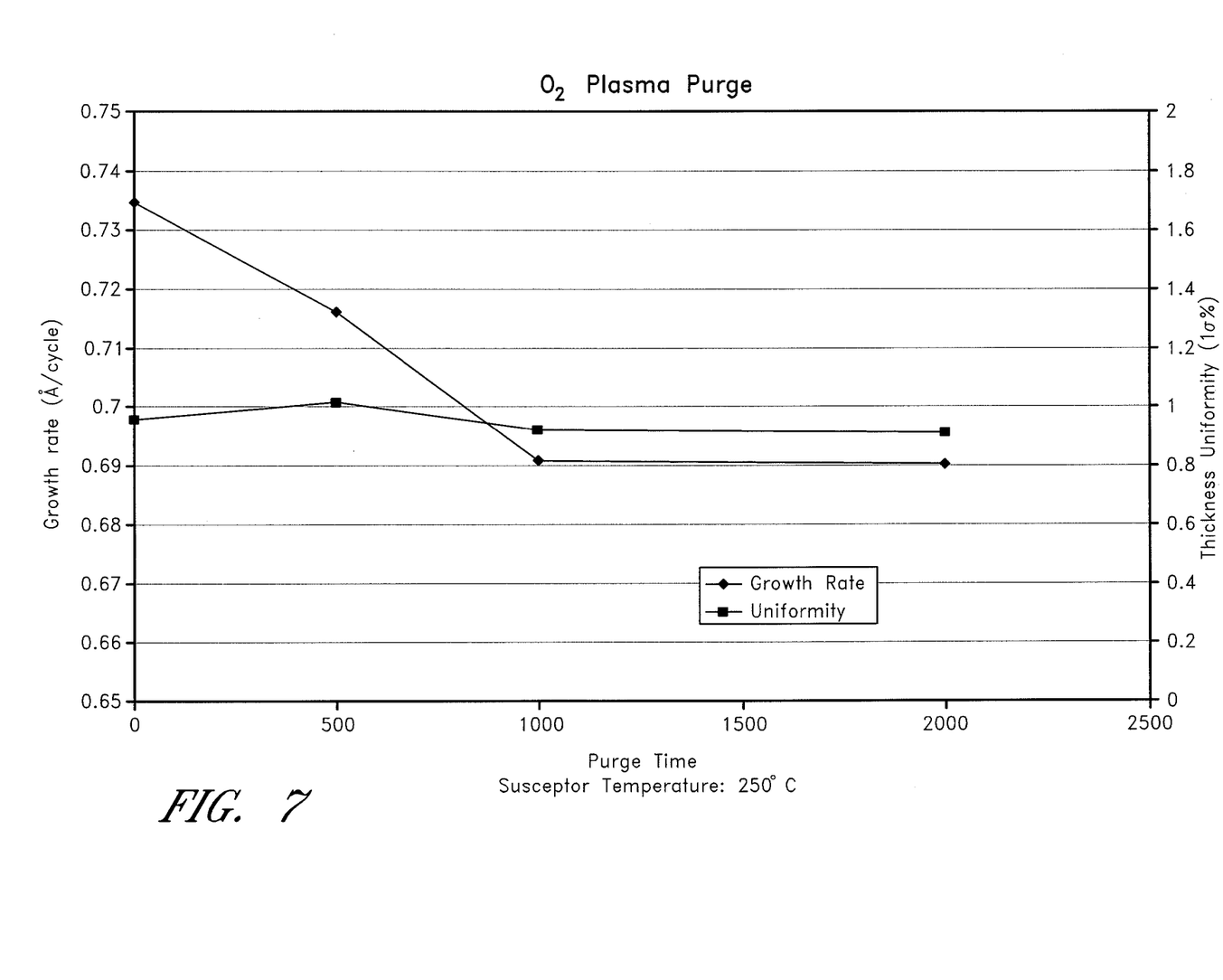
FIG. 7 is a graph illustrating the relationship between the film growth rate/thickness uniformity of a zirconium oxide thin film and the purge duration of oxygen plasma in a PEALD process according to some embodiments of the invention.

Similarly, decreasing the duration D3 (FIG. 2) of RF power application was not found to significantly adversely affect the growth rate and thickness uniformity of the film (see FIG. 6). Decreasing the duration D4 (FIG. 2) of purge after the RF power application did not adversely affect the growth rate and thickness uniformity of the film (see FIG. 7). As the duration D4 of the purge was decreased to 0, the growth rate increased.

EXAMPLES

A zirconium oxide ($ZrO_2$) film was deposited on a 300 mm silicon wafer in a PEALD reactor having a showerhead (ASM Polygon 8300 Cluster tool in EmerALD® dielectric module) available from ASM America, Inc. (Phoenix, Ariz.). The wafer was placed on a susceptor within the reactor.

In Examples 1-6 described below, the temperature of the reactor was maintained at 100° C. to 350° C. during deposition. The temperature of a supply line from a gas source to the reactor was maintained at 120° C. The temperature of the showerhead was maintained at 130° C. Pressure in the reactor during deposition was maintained at 6 torr.

During the deposition, 120 sccm of oxygen gas ($O_2$) was continuously supplied into the reactor. 500 sccm of argon gas (Ar) was continuously supplied into the reactor. Bis(methylcyclopentadienyl)methylmethoxy zirconium (IV) (hereinafter, referred to as "ZrD-04") available from Epichem Limited (Wirral, Great Britain) was supplied as a metal precursor into the reactor.

Examples 1-3

The deposition was conducted repeating a cycle which includes four steps of: (1) supplying the metal precursor into the reactor for 1.5 seconds; (2) purging for 4 seconds; (3) applying RF power to the reactor for 300 milliseconds; and (4) purging for 2 seconds. During the step (3), 75 W of RF power was applied to the reactor to generate in-situ oxygen plasma. Steps (1)-(4) were repeated until a zirconium oxide film having a thickness of about 100 Å was formed on the wafer.

In Example 1, the temperature of the susceptor was maintained at 150° C. In Example 2, the temperature of the susceptor was maintained at 250° C. In Example 3, the temperature of the susceptor was maintained at 350° C. The atomic concentrations of the zirconium oxide films resulting from Examples 1-3 are shown in Table 1 below. In Table 1, "HT" stands for a high-throughput process with shortened purge steps.

TABLE 1

|  | Zr (atomic %) | O (atomic %) | C (atomic %) | H (atomic %) |
|---|---|---|---|---|
| Example 1 (150° C.; 75 W) | 32 | 60 | 3 | 5 |
| Example 2 (250° C.; 75 W) | 32 | 64 | 1 | 2.6 |
| Example 3 (350° C.; 75 W) | 37 | 61 | <1 | 2 |
| Example 4 (100° C.; 200 W) | 28 | 61 | 2 | 9 |
| Example 5 (150° C.; 75 W; HT) | 30 | 60 | 2 | 7 |
| Example 6 (150° C.; 200 W: HT) | 33 | 61 | <1 | 5 |

The crystal structure resulting from Example 1 was mainly amorphous with some crystallinity. The crystal structure resulting from Example 2 was cubic and tetragonal. The crystal structure resulting from Example 3 included a mixture of monoclinic/tetragonal phase.

Example 4

In Example 4, deposition was conducted under the same conditions as in Examples 1-3 except that 200 W of RF power was applied to the reactor during the step (3) and the temperature of the susceptor was maintained at 100° C. The atomic concentrations of the zirconium oxide film resulting from Example 4 are shown in Table 1 above.

Examples 5 and 6

In Examples 5 and 6, deposition was conducted with shortened purge steps. The deposition was conducted repeating a cycle which includes four steps of: (1) supplying the metal precursor into the reactor for 300 milliseconds; (2) purging for 50 milliseconds; (3) applying RF power to the reactor for 300 milliseconds; and (4) purging for 50 milliseconds. The cycle was repeated until a zirconium oxide film of thickness of about 100 Å was formed on the wafer.

In Example 5, the temperature of the susceptor was maintained at 150° C. During the step (3) of Example 5, 75 W of RF power was applied to the reactor to generate in-situ oxygen plasma. In Example 6, the temperature of the susceptor was maintained at 150° C. During the step (3) of Example 6, 200 W of RF power was applied to the reactor to generate in-situ oxygen plasma. The atomic concentrations of the zirconium oxide films resulting from Examples 5 and 6 are shown in Table 1 above. The growth rate of Example 5 was about 39 Å/minute. The growth rate of Example 6 was about 39 Å/minute.

Electronic Devices

The embodiments of the deposition process described above may be used for forming metal oxide films that can be part of various electronic devices. Examples of the electronic device include, but are not limited to, consumer electronic products, electronic circuits, electronic circuit components, parts of the consumer electronic products, electronic test equipments, etc. The consumer electronic products may include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device may include unfinished or partially fabricated products.

The low-temperature process described above does not adversely affect a thermally unstable material which has been already formed in a partially fabricated device during deposition of a metal oxide film on the device. For example, in some embodiments, materials chemically and/or physically unstable at temperatures of 200° C. or 250° C. or above are not adversely affected. In addition, the process can be conducted with relatively short or substantially no purge steps while having substantially no adverse effect on the growth rate of the films. Thus, the throughput of the process can be significantly improved. Furthermore, the resulting metal oxide films have similar thickness uniformity, index of refraction and/or crystal structure as films deposited by a higher temperature process. In addition, the process produces fewer impurity particles than a higher temperature process alternating two or more precursors because the metal precursor does not react with oxygen gas and background water at the low temperature that the process uses.

In at least some of the aforesaid embodiments, any element used in an embodiment can interchangeably be used in another embodiment unless such a replacement is not feasible. It will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. A method of forming a metal oxide thin film over a substrate, the method comprising:
   conducting a plurality of deposition cycles, each cycle comprising:
      supplying oxygen gas and an inert gas into a reaction space substantially continuously throughout the cycle, wherein a substrate is disposed in the reaction space;
      supplying a pulse of a metal precursor into the reaction space, the metal precursor comprising a cyclopentadienyl compound of the metal, wherein supplying the pulse of the metal precursor overlaps temporally with supplying the oxygen gas and the inert gas; and
      activating the oxygen gas by forming plasma-excited oxygen species to expose the substrate to the plasma-excited oxygen species in the reaction space after the pulse of the metal precursor, wherein activating the oxygen gas overlaps temporally with supplying the oxygen gas and the inert gas.

2. The method of claim 1, wherein activating the oxygen gas comprises generating an in-situ plasma in the reaction space.

3. The method of claim 1, wherein the cycle is conducted at a temperature below about 400° C.

4. The method of claim 3, wherein the cycle is conducted at a temperature between about 100° C. and about 250° C.

5. The method of claim 1, wherein the substrate includes a structure preformed thereon, and wherein the structure is formed of a material that is unstable at a temperature greater than about 250° C.

6. The method of claim 5, wherein the material is unstable at a temperature greater than about 100° C.

7. The method of claim 6, wherein the material comprises at least one of low-k dielectric materials, organic semiconductor materials, and organic light emitting materials.

8. The method of claim 1, wherein the metal is selected from the group consisting of Zr, Sc, La, Ce, Pr, Nd, Sm, Eu, Gd, Th, Dy, Ho, Er, Tm, Yb, Lu, Sr, Ba, Hf, Ta, Y, Ti, and Nb.

9. The method of claim 8, wherein the cyclopentadienyl compound is selected from the group consisting of mono-cyclopentadienyl compounds and bis-cyclopentadienyl compounds.

10. The method of claim 9, wherein the bis-cyclopentadienyl compound is represented by Formula 1:

$$(R^1Cp)_2MR^2R^3 \qquad \text{Formula 1}$$

wherein Cp is a cyclopentadienyl ligand;

wherein M is a metal selected from the group consisting of Zr, Sc, La, Ce, Pr, Nd, Sm, Eu, Gd, Th, Dy, Ho, Er, Tm, Yb, Lu, Sr, Ba, Hf, Ta, Y, Ti, and Nb;

wherein $R^1$ is hydrogen, a C5-C6 alkyl group, a C5-C6 alkoxy group, or an amido group; and wherein $R^2$ and $R^3$ are the same as or different from each other, and each of $R^2$ and $R^3$ is a C5-C6 alkyl group, a C5-C6 alkoxy group, or an amido group.

11. The method of claim 9, wherein the mono-cyclopentadienyl compound is represented by Formula 2:

$$(R^1Cp)MR^2R^3R^4 \qquad \text{Formula 2}$$

wherein Cp is a cyclopentadienyl ligand;

wherein M is a metal selected from Zr, Sc, La, Ce, Pr, Nd, Sm, Eu, Gd, Th, Dy, Ho, Er, Tm, Yb, Lu, Sr, Ba, Hf, Ta, Y, Ti, and Nb;

wherein $R^1$ is hydrogen, a C5-C6 alkyl group, a C5-C6 alkoxy group, or an amido group; and wherein $R^2$, $R^3$, and $R^4$ are the same as or different from one another and each of $R^2$, $R^3$, and $R^4$ is a C5-C6 alkyl group, a C5-C6 alkoxy group, or an amido group.

12. The method of claim 1, wherein the cycle is conducted for a duration of about 400 milliseconds to about 8,000 milliseconds.

13. The method of claim 12, wherein supplying the metal precursor comprises supplying the metal precursor for a period of time between about 200 milliseconds and about 2,000 milliseconds.

14. The method of claim 12, wherein activating the oxygen gas comprises applying RF power to the reaction space for a period of time between about 200 milliseconds and about 2,000 milliseconds.

15. The method of claim 1, wherein the cycle further comprises purging excess metal precursor from the reaction space after supplying the metal precursor and before activating the oxygen gas.

16. The method of claim 15, wherein purging the excess metal precursor comprises flowing the oxygen gas and the inert gas.

17. The method of claim 1, wherein the cycle does not include purging excess metal precursor from the reaction space after supplying the metal precursor and before activating the oxygen gas.

18. The method of claim 1, wherein the cycle further comprises purging excess activated oxygen gas after activating the oxygen gas.

19. The method of claim 18, wherein purging the excess activated oxygen gas comprises flowing the oxygen gas and the inert gas.

20. The method of claim 1, wherein the inert gas comprises argon (Ar) gas.

21. The method of claim 1, further comprising repeating the cycle until a metal oxide film of a selected thickness is formed.

22. An integrated circuit device comprising:
a substrate; and
a metal oxide film formed over the substrate, the metal oxide film being made by the method of claim 1.

23. The device of claim 22, further comprising a structure formed of a material that is unstable at a temperature greater than about 250° C.

24. The device of claim 23, wherein the material is unstable at a temperature greater than about 100° C.

25. The device of claim 24, wherein the material comprises at least one selected from the group consisting of a low-k dielectric material, an organic semiconductor material, and an organic light emitting material.

26. The method of claim 1, wherein conducting the deposition cycle comprises conducting the deposition cycle at a deposition temperature, and wherein the metal precursor does not react with the oxygen gas at the deposition temperature when the oxygen gas is not activated.

* * * * *